(12) United States Patent
Cho

(10) Patent No.: US 12,087,351 B2
(45) Date of Patent: Sep. 10, 2024

(54) BIT LINE SENSE AMPLIFIER AND MEMORY DEVICE INCLUDING THE SAME

(71) Applicant: Samsung Electronics Co., Ltd., Suwon-si (KR)

(72) Inventor: Seongjin Cho, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 199 days.

(21) Appl. No.: 17/857,015

(22) Filed: Jul. 3, 2022

(65) Prior Publication Data

US 2023/0121199 A1 Apr. 20, 2023

(30) Foreign Application Priority Data

Oct. 14, 2021 (KR) .................. 10-2021-0136693

(51) Int. Cl.
| | |
|---|---|
| G11C 7/00 | (2006.01) |
| G11C 11/4076 | (2006.01) |
| G11C 11/408 | (2006.01) |
| G11C 11/4091 | (2006.01) |
| G11C 11/4094 | (2006.01) |
| G11C 11/4096 | (2006.01) |

(52) U.S. Cl.
CPC ...... *G11C 11/4091* (2013.01); *G11C 11/4076* (2013.01); *G11C 11/4085* (2013.01); *G11C 11/4094* (2013.01); *G11C 11/4096* (2013.01)

(58) Field of Classification Search
CPC .................................................. G11C 11/4091
USPC ........................................................ 365/205
See application file for complete search history.

(56) References Cited

U.S. PATENT DOCUMENTS

| | | | |
|---|---|---|---|
| 9,741,399 B2 | 8/2017 | Tiwari | |
| 10,346,092 B2 | 7/2019 | Lea et al. | |
| 2016/0225433 A1 | 8/2016 | Bains et al. | |
| 2019/0378561 A1 | 12/2019 | Kubo et al. | |
| 2021/0200783 A1 | 7/2021 | Crawford et al. | |
| 2022/0068371 A1* | 3/2022 | Pallerla | G11C 7/227 |
| 2022/0310156 A1* | 9/2022 | Raj | G11C 11/418 |

FOREIGN PATENT DOCUMENTS

| | | |
|---|---|---|
| JP | H05217364 A | 8/1993 |
| JP | H0831168 A | 2/1996 |

\* cited by examiner

*Primary Examiner* — Hoai V Ho
(74) *Attorney, Agent, or Firm* — Muir Patent Law, PLLC

(57) ABSTRACT

A bit line sense amplifier includes a first inverter having an output terminal connected to a complementary sensing bit line, a second inverter having an output terminal connected to a sensing bit line, a first offset element connecting a bit line to the complementary sensing bit line and a second offset element connecting a complementary bit line to the sensing bit line, in response to an offset cancellation signal. During a first time interval, the first offset element and the second offset element are turned off and a capacitor of a first memory cell is connected to the bit line. During a second time interval after the first time interval, the first offset element and the second offset element are turned on and the capacitor of the first memory cell is disconnected from the bit line.

8 Claims, 26 Drawing Sheets

811

| D7 | D6 | D5 | D4 | D3 | D2 | D1 | D0 |
|---|---|---|---|---|---|---|---|
| 0 | 0 | 0 | 0 | 0 | 0 | 0 | 0 |

813

| D7 | D6 | D5 | D4 | D3 | D2 | D1 | D0 | DBI |
|---|---|---|---|---|---|---|---|---|
| 0 | 0 | 0 | 0 | 0 | 0 | 0 | 0 | 0 |

812 ⇩

| D7 | D6 | D5 | D4 | D3 | D2 | D1 | D0 |
|---|---|---|---|---|---|---|---|
| 1 | 1 | 1 | 1 | 1 | 1 | 1 | 1 |

814 ⇩

| D7 | D6 | D5 | D4 | D3 | D2 | D1 | D0 | DBI |
|---|---|---|---|---|---|---|---|---|
| 0 | 0 | 0 | 0 | 0 | 0 | 0 | 0 | 1 |

BIT LINE SENSE AMPLIFIER AND MEMORY DEVICE INCLUDING THE SAME

CROSS-REFERENCE TO RELATED APPLICATION(S)

This application claims priority under 35 USC 119(a) to Korean Patent Application No. 10-2021-0136693 filed on Oct. 14, 2021 in the Korean Intellectual Property Office, the disclosure of which is incorporated herein in its entirety by reference.

BACKGROUND

The present inventive concept relates to a bit line sense amplifier and a memory device including the same.

A memory device may store data and read the stored data, and may include a memory cell array in which memory cells storing the data are arranged, a sense amplifier connected to the memory cells to write or read data, and the like. Recently, a memory device capable of executing various operations as well as data storage has been proposed. However, in order to execute an operation in the memory device, a separate circuit for executing the operation needs to be provided in the memory device, which may decrease a degree of integration of the memory device. Accordingly, it is desired that a memory device capable of executing a particular operation without an additional circuit is provided.

SUMMARY

Example embodiments provide a bit line sense amplifier capable of executing a NOT operation without adding a separate circuit, and a memory device capable of decreasing power consumption and improving performance using the same.

According to example embodiments, a bit line sense amplifier includes a first inverter, a second inverter, a first offset element, and a second offset element. The first inverter may be connected between a first node to which a first sensing driving voltage is applied and a second node to which a second sensing driving voltage is applied, and the first inverter may have an output terminal connected to a complementary sensing bit line. The second inverter may be connected between the first node and the second node, and may have an output terminal connected to the sensing bit line. The first offset element may be configured to connect a bit line of a first memory cell to the complementary sensing bit line in response to an offset cancellation signal. The second offset element may be configured to connect a complementary bit line of a second memory cell to the sensing bit line in response to the offset cancellation signal. In a first read operation of the bit line sense amplifier, during a first time interval, the first offset element and the second offset element are turned off and a capacitor of the first memory cell is electrically connected to the bit line, and during a second time interval after the first time interval, the first offset element and the second offset element are turned on and the capacitor of the first memory cell is electrically disconnected from the bit line.

According to example embodiments, a memory device includes a memory cell array, a plurality of bit line sense amplifiers, and a control logic. The memory cell array includes a plurality of memory cells, and the plurality of bit line sense amplifiers may be connected to the plurality of memory cells through a plurality of bit lines and a plurality of complementary bit lines. The control logic may be configured to control the plurality of bit line sense amplifiers to execute a first read operation and a second read operation of reading data stored in a portion of the plurality of memory cells. In the first read operation, the plurality of bit line sense amplifiers invert the data stored in the portion of plurality of memory cells and output the inverted data, and in the second read operation, the plurality of bit line sense amplifiers output the data stored in the portion of plurality of memory cells.

According to example embodiments, a bit line sense amplifier may include an amplifying circuit, a first offset cancellation circuit, and a second offset cancellation circuit. The amplifying circuit may be connected between a sensing bit line and a complementary sensing bit line and may have a plurality of P-channel metal oxide semiconductor (PMOS) elements and a plurality of N-channel metal oxide semiconductor (NMOS) elements. The first offset cancellation circuit may be connected between the amplifying circuit and a first memory cell and may include a first offset element and a first isolation element. The second offset cancellation circuit may be connected between the amplifying circuit and a second memory cell and may include a second offset element and a second isolation element. The first offset element may be connected between the first memory cell and the complementary sensing bit line and the second offset element may be connected between the second memory cell and the sensing bit line. The first isolation element may be connected between the first memory cell and the sensing bit line and the second isolation element may be connected between the second memory cell and the complementary sensing bit line. In a first read operation of the bit line sense amplifier, during a first pre-charging time, the first offset element, the first isolation element, the second offset element, and the second isolation element are turned on, during a first charge sharing time after the first pre-charging time. the first offset element, the first isolation element, the second offset element, and the second isolation element are turned off, and during a first offset canceling time after the first charge sharing time, the first offset element and the second offset element are turned on and the first isolation element and the second isolation element are turned off.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
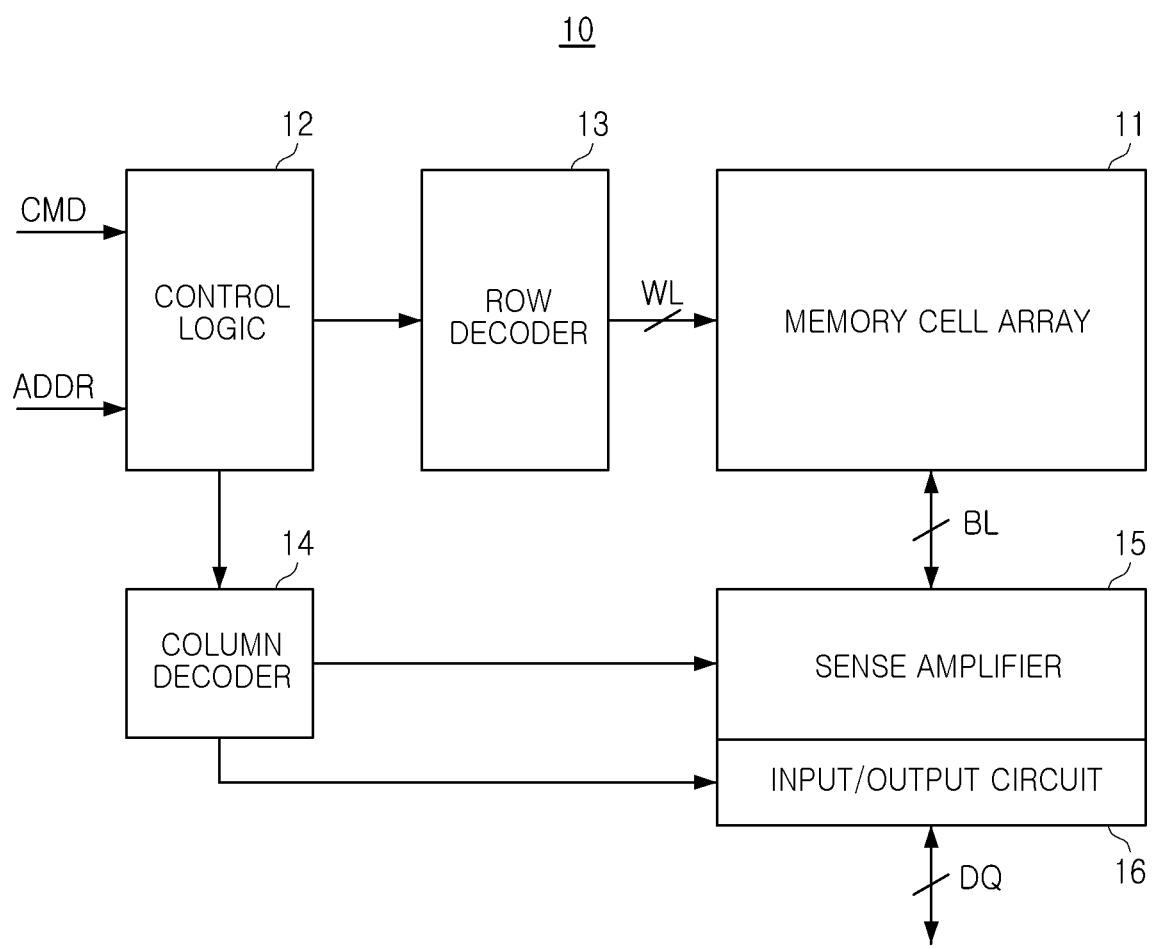
FIG. 1 is a schematic block diagram illustrating a memory device according to an example embodiment.

FIG. 1 is a schematic block diagram illustrating a memory device according to an example embodiment.

Referring to FIG. 1, a memory device 10 may be a storage device based on a semiconductor element. The memory device 10 may be a random access memory (RAM) device such as a dynamic random access memory (DRAM), a synchronous DRAM (SDRAM), a static RAM (SRAM), a double date rate SDRAM (DDR SDRAM), a DDR2 SDRAM, a DDR3 SDRAM, a phase-change RAM (PRAM), a magnetic RAM (MRAM), or a resistive RAM (RRAM). The memory device 10 may store data received through a data signal DQ or may output data as a data signal DQ in response to an address signal ADDR and a control command signal CMD received from an external host (e.g., a central processing unit (CPU), an application processor (AP), or a system-on-chip (SoC)). The memory device 10 may include a memory cell array 11, a control logic 12, a row decoder 13, a column decoder 14, a sense amplifier 15, and an input/output circuit 16.

The memory cell array 11 may include a plurality of memory cells. The plurality of memory cells may be connected to the row decoder 13 and the sense amplifier 15 through a plurality of word lines WL and a plurality of bit lines BL, respectively. Hereinafter, it will be understood that when an element is referred to as being "connected" to another element, it may be "electrically connected" and also be "physically connected" to the other element. In contrast, when an element is referred to as being "disconnected" to another element, it may be "electrically disconnected" and also be "physically disconnected" to the other element.". The plurality of memory cells may be positioned, respectively, at points where the plurality of word lines WL and the plurality of bit lines BL intersect each other. The plurality of memory cells may be arranged in a matrix form in the memory cell array 11, and each of the plurality of memory cells may include at least one memory element for storing data. As an example, when the memory device 10 is the DRAM, each of the plurality of memory cells may include a switch element and a cell capacitor.

The control logic 12 may receive the address signal ADDR and the control command signal CMD from the external host. The address signal ADDR may include a row address indicating a row in the memory cell array 11 and a column address indicating a column in the memory cell array 11. As an example, the row decoder 13 may select at least one of the plurality of word lines WL with reference to the row address, and the column decoder 14 may select at least one of the plurality of bit lines BL with reference to the column address.

The sense amplifier 15 may include a plurality of bit line sense amplifiers connected to the memory cell array 11 through the plurality of bit lines BL. A bit line sense amplifier connected to a selected bit line selected by the column decoder 14 among the plurality of bit line sense amplifiers may read data from at least one of memory cells connected to the selected bit line. The input/output circuit 16 may output the data read by the bit line sense amplifier as the data signal DQ.

Each of the plurality of bit line sense amplifiers may include a plurality of P-channel metal oxide semiconductor (PMOS) elements (or transistors), a plurality of N-channel metal oxide semiconductor (NMOS) elements (or transistors), and offset elements (or transistors). The offset elements may be elements provided in order to cancel an offset between at least some of the plurality of PMOS elements and the plurality of NMOS elements.

In an example embodiment, each of the plurality of bit line sense amplifiers may execute a first read operation and a second read operation. In the first read operation, the bit line sense amplifier may sequentially execute a pre-charging operation, a charge sharing operation, and an offset canceling operation, and may execute a NOT operation of inverting data stored in the memory cell by executing the charge sharing operation prior to the offset canceling operation. Meanwhile, in the second read operation, the bit line sense amplifier may sequentially execute a pre-charging operation, an offset canceling operation, and a charge sharing operation, and may read data stored in the memory cell as it is. Accordingly, the bit line sense amplifier may support the NOT operation without adding a separate operation circuit, and the NOT operation may thus be implemented without decreasing a degree of integration of the memory device.

Figure 2:
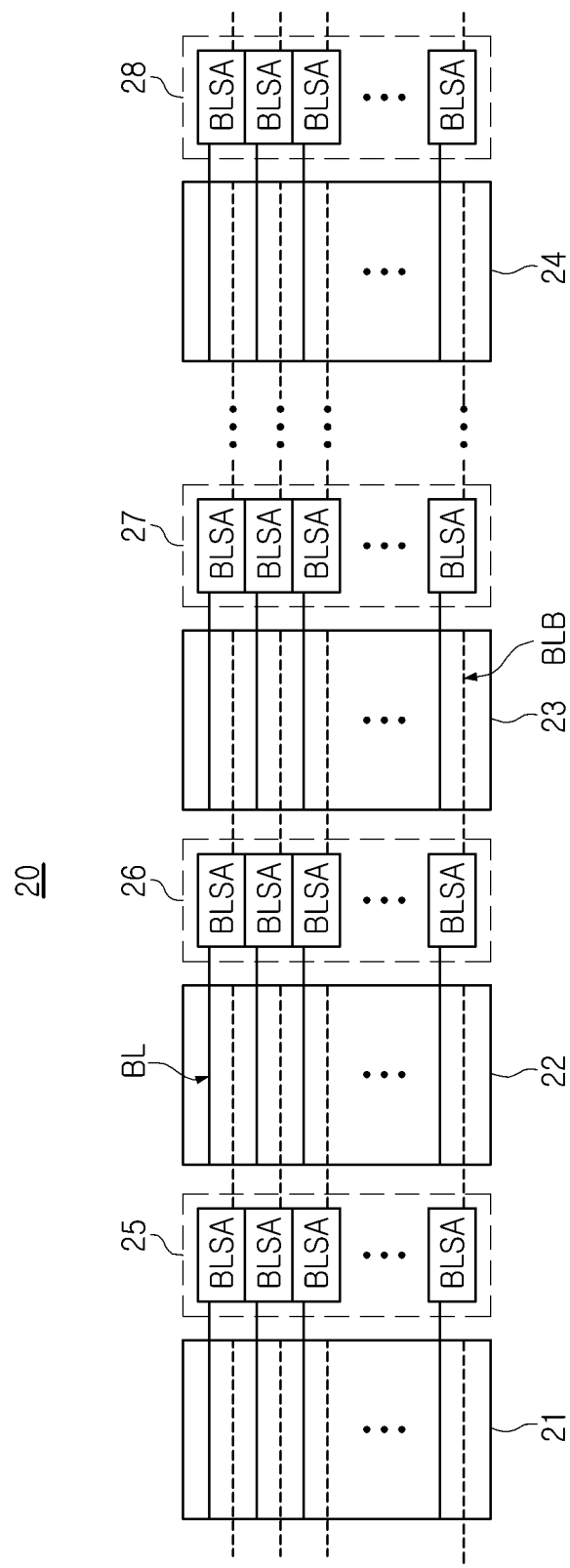
FIGS. 2 and 3 are, respectively, a schematic block diagram and a schematic circuit diagram illustrating a structure of a memory device according to an example embodiment.
Figure 3:
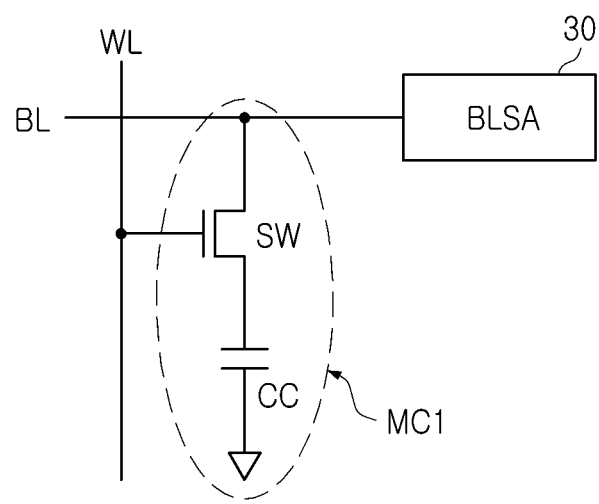

FIGS. 2 and 3 are, respectively, a schematic block diagram and a schematic circuit diagram illustrating a structure of a memory device according to an example embodiment.

First, referring to FIG. 2, a memory device 20 may include a plurality of subarrays 21 to 24 in which memory cells are disposed respectively and a plurality of sense amplifiers 25 to 28. Each of the plurality of sense amplifiers 25 to 28 may include a plurality of bit line sense amplifiers BLSA.

As illustrated in FIG. 2, the memory cells in each of the plurality of subarrays 21 to 24 may be connected to at least one of bit lines BL and complementary bit lines BLB, and each of the plurality of bit line sense amplifiers BLSA may be connected to one of the bit lines BL and one of the complementary bit lines BLB. Accordingly, each of the plurality of bit line sense amplifiers BLSA may be connected to the memory cells in an open bit line manner.

Referring to FIG. 3, one bit line sense amplifier 30 is connected to a first memory cell MC1 through a bit line BL, and may be connected to a second memory cell MC2 through a complementary bit line BLB. In an example embodiment, each of the first memory cell MC1 and the second memory cell MC2 may include a switch element SW and a cell capacitor CC. As described above with reference to FIG. 2, the first memory cell MC1 and the second memory cell MC2 may be memory cells disposed in different subarrays 21 to 24.

Figure 4:
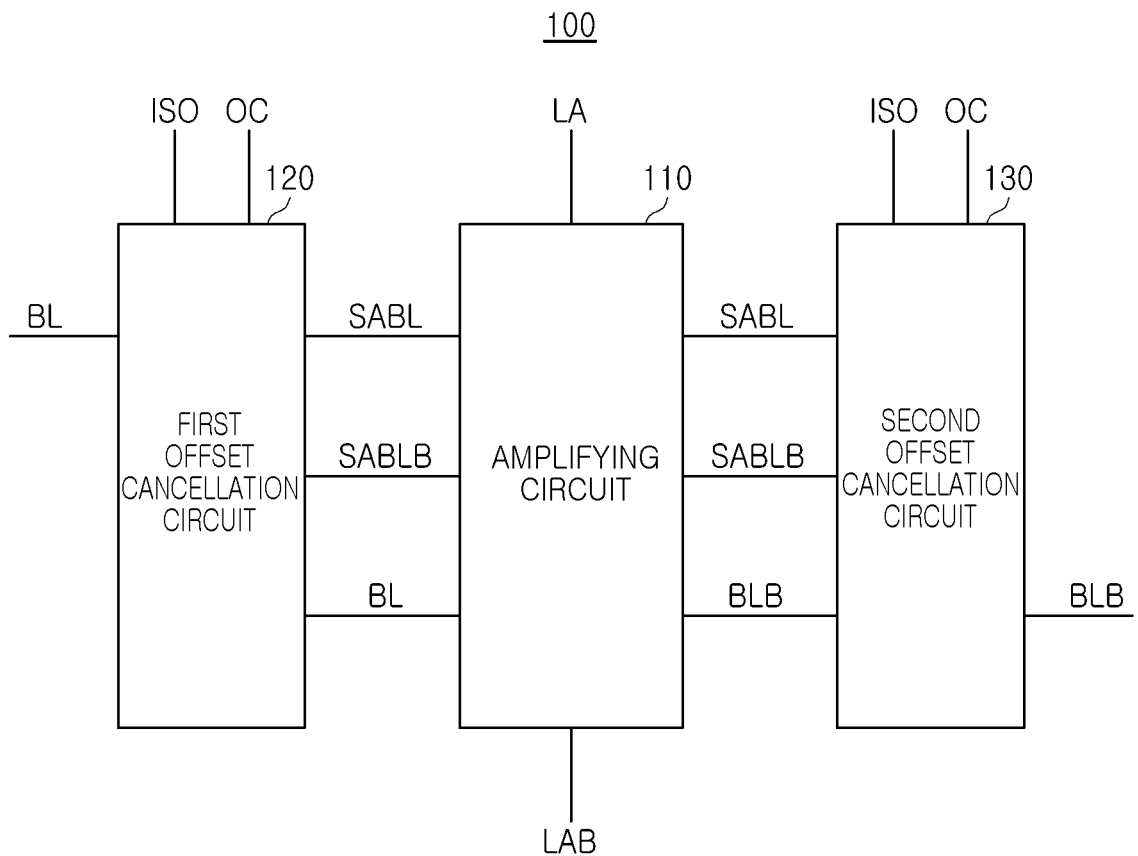
FIG. 4 is a schematic block diagram illustrating a bit line sense amplifier according to an example embodiment.

FIG. 4 is a schematic block diagram illustrating a bit line sense amplifier according to an example embodiment.

Referring to FIG. 4, a bit line sense amplifier 100 according to an example embodiment may include an amplifying circuit 110, a first offset cancellation circuit 120, a second offset cancellation circuit 130, and the like. The amplifying circuit 110 may be connected to the first offset cancellation circuit 120 through a bit line BL, a sensing bit line SABL, and a complementary sensing bit line SABLB, and the first offset cancellation circuit 120 may be connected to a memory cell through a bit line BL. In addition, the amplifying circuit 110 may be connected to the second offset cancellation circuit 130 through a complementary bit line BLB, a sensing bit line SABL, and a complementary sensing bit line SABLB, and the second offset cancellation circuit 130 may be connected to a memory cell through a complementary bit line BLB.

The first offset cancellation circuit 120 and the second offset cancellation circuit 130 may operate in response to an isolation control signal ISO and an offset cancellation signal OC. For example, the first offset cancellation circuit 120 may isolate the bit line BL and the sensing bit line SABL from each other in response to the isolation control signal ISO, and may isolate the bit line BL and the complementary sensing bit line SABLB from each other in response to the offset cancellation signal OC. Similarly, the second offset cancellation circuit 130 may isolate the complementary bit line BLB and the complementary sensing bit line SABLB from each other in response to the isolation control signal ISO, and may isolate the complementary bit line BLB and the sensing bit line SABL from each other in response to the offset cancellation signal OC.

The amplifying circuit 110 may include a plurality of PMOS elements and a plurality of NMOS elements, and may include, for example, a plurality of inverters connected to each other. The amplifying circuit 110 may amplify a difference between a voltage of the bit line BL and a voltage of the complementary bit line BLB according to a first sensing driving voltage LA and a second sensing driving voltage LAB. As an example, a gate of one of the plurality of NMOS elements included in the amplifying circuit 110 may be electrically connected to the bit line BL, and a gate of the other of the plurality of NMOS elements may be electrically connected to the complementary bit line BLB.

Figure 5:
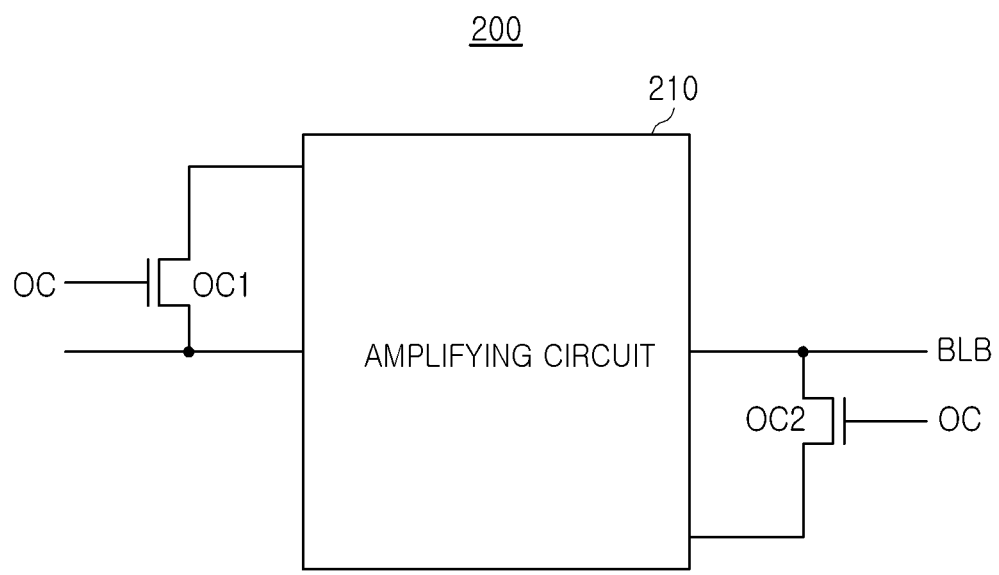
FIGS. 5 and 6 are schematic circuit diagrams illustrating bit line sense amplifiers according to an example embodiment.
Figure 6:
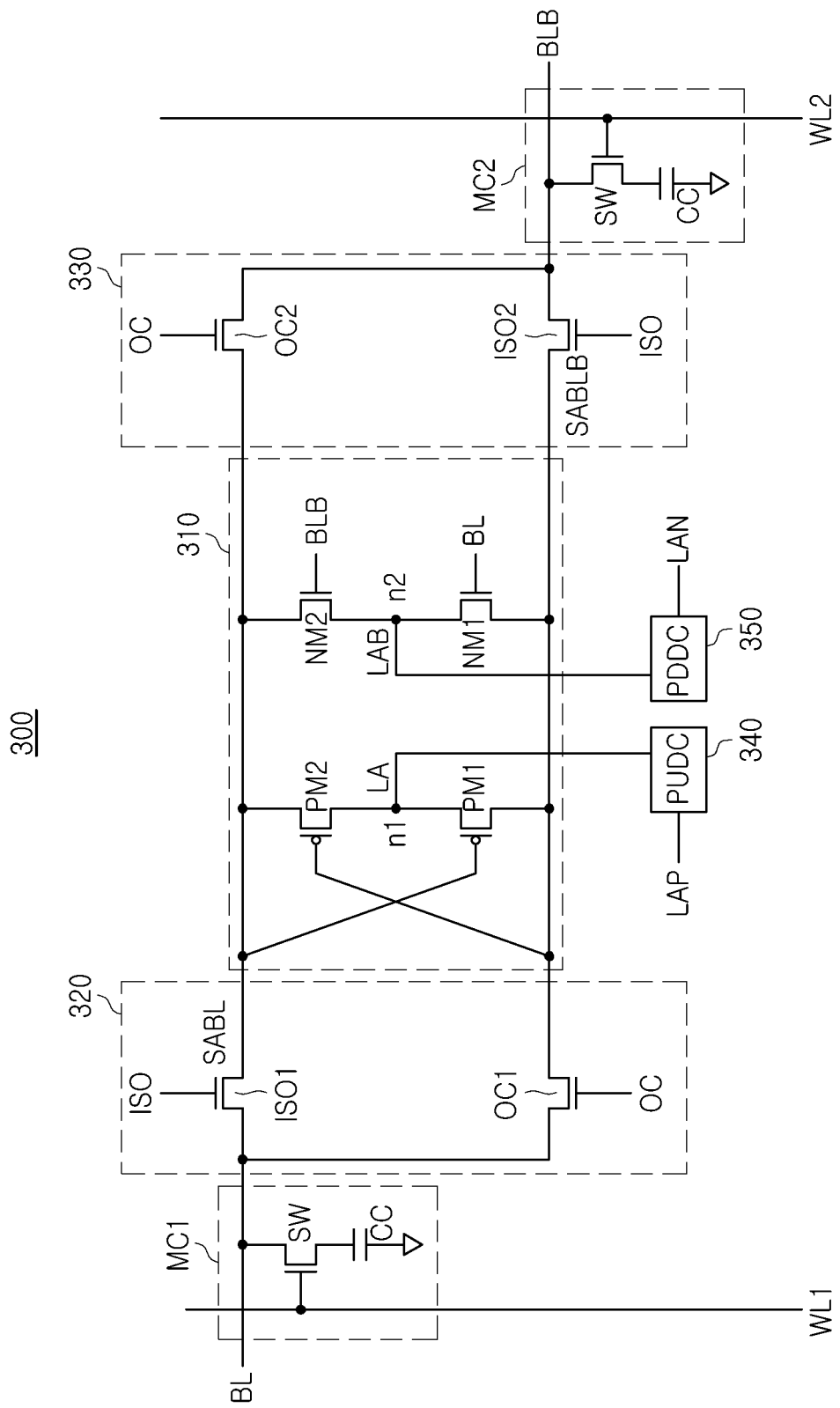

FIGS. 5 and 6 are schematic circuit diagrams illustrating bit line sense amplifiers according to an example embodiment.

Referring to FIG. 5, a bit line sense amplifier 200 may include an amplifying circuit 210, a first offset element OC1, a second offset element OC2, and the like. The amplifying circuit 210 may include a first inverter INV1 and a second inverter INV2, and each of the first offset element OC1 and the second offset element OC2 may be turned on and turned off in response to one offset cancellation signal OC.

The amplifying circuit 210 may be connected to a bit line BL and a complementary bit line BLB, the first offset element OC1 may be connected between the bit line BL and the amplifying circuit 210, and the second offset element OC2 may be connected between the complementary bit line BLB and the amplifying circuit 210. As an example, the first offset element OC1 may be connected between the bit line BL and an NMOS element included in the first inverter INV1, and the second offset element OC2 may be connected between the complementary bit line BLB and an NMOS element included in the second inverter INV2.

A structure of a bit line sense amplifier according to an example embodiment will hereinafter be described in more detail with reference to FIG. 6.

Referring to FIG. 6, a bit line sense amplifier 300 according to an example embodiment may include an amplifying circuit 310, a first offset cancellation circuit 320, a second offset cancellation circuit 330, a pull-up driving circuit (PUDC) 340, a pull-down driving circuit (PDDC) 350, and the like. As described above with reference to FIG. 5, the amplifying circuit 310 may be connected to a bit line BL through the first offset cancellation circuit 320, and may be connected to a complementary bit line BLB through the second offset cancellation circuit 330. A first memory cell MC1 connected to the bit line BL and a first word line WL1 may be disposed in a different subarray from a second memory cell MC2 connected to the complementary bit line BLB and a second word line WL2. Each of the first memory cell MC1 and the second memory cell MC2 may include a switch element SW and a cell capacitor CC.

The amplifying circuit 310 may include a first PMOS element PM1, a second PMOS element PM2, a first NMOS element NM1, a second NMOS element NM2, and the like. The first PMOS element PM1 and the first NMOS element NM1 may be connected to each other to provide a first inverter, and the second PMOS element PM2 and the second NMOS element NM2 may be connected to each other to provide a second inverter. A first node n1 between the first PMOS element PM1 and the second PMOS element PM2 may receive a first sensing driving voltage LA, and a second node n2 between the first NMOS element NM1 and the second NMOS element NM2 may receive a second sensing driving voltage LAB.

The first PMOS element PM1 may be connected between the first node n1 to which the first sensing driving voltage LA is supplied and a complementary sensing bit line SABLB. The second PMOS element PM2 may be connected between the first node n1 and a sensing bit line SABL. A gate of the first PMOS element PM1 may be connected to the sensing bit line SABL, and a gate of the second PMOS element PM2 may be connected to the complementary sensing bit line SABLB.

The first NMOS element NM1 may be connected between the second node n2 to which the second sensing driving voltage LAB is supplied and the complementary sensing bit line SABLB. The second NMOS element NM2 may be connected between the second node n2 and the sensing bit line SABL. A gate of the first NMOS element NM1 may be connected to the bit line BL, and a gate of the second NMOS element NM2 may be connected to the complementary bit line BLB.

The first offset cancellation circuit 320 may include a first offset element OC1 and a first isolation element ISO1. The first offset element OC1 may be connected between the bit line BL and the complementary sensing bit line SABLB, and accordingly, the bit line BL and the complementary sensing bit line SABLB may be connected to or disconnected from each other by the first offset element OC1. The first isolation element ISO1 may be connected between the bit line BL and the sensing bit line SABL. Accordingly, the bit line BL and the sensing bit line SABL may be connected to or disconnected from each other by turning on/off the first isolation element ISO1. The first offset element OC1 may be controlled by an offset cancellation signal OC, and the first isolation element ISO1 may be controlled by an isolation control signal ISO.

The second offset cancellation circuit 330 may include a second offset element OC2 and a second isolation element ISO2. The second offset element OC2 may be connected between the complementary bit line BLB and the sensing bit line SABL, and the complementary bit line BLB and the sensing bit line SABL may be connected to or disconnected from each other by the second offset element OC2. The second isolation element ISO2 may be connected between the complementary bit line BLB and the complementary sensing bit line SABLB. Accordingly, the complementary bit line BLB and the complementary sensing bit line SABLB may be connected to or disconnected from each other by turning on/off the second isolation element ISO2. The second offset element OC2 may be controlled by the offset cancellation signal OC, and the second isolation element ISO2 may be controlled by the isolation control signal ISO.

The PUDC 340 may include one or more PMOS elements, and the PDDC 350 may include one or more NMOS elements. The PUDC 340 may generate the first sensing driving voltage LA in response to a first sense amplifier enable signal LAP and the PDDC 350 may generate the second sensing driving voltage LAB in response to a second sense amplifier enable signal LAN. In an embodiment, the first sensing driving voltage LA may include a plurality of voltages higher than a predetermined pre-charging voltage $V_{PRE}$ (e.g., ½ VDD), for example, ¾ VDD and VDD. In an embodiment, the second sensing driving voltage LAB may include a plurality of voltages lower than the pre-charging voltage $V_{PRE}$, for example, ¼ VDD and VSS. In an embodiment, the first sense amplifier enable signal LAP may be one or more sense amplifier enable signals, and the second sense amplifier enable signal LAN may be one or more sense amplifier enable signals. For example, the PUDC 340 may generate the first sensing driving voltage LA having ¾ VDD or VDD in response to one or more first sense amplifier enable signals LAP, and the PDDC 350 may generate the second sensing driving voltage LAB having ¼ VDD or VSS in response to one or more second sense amplifier enable signals LAN. Herein, the VDD may be a power supply voltage and the VSS may be a ground voltage. The first and second sense amplifier enable signals LAP and LAN may have a plurality of bits each having a logic level '0' or a logic level '1.'

Figure 7:
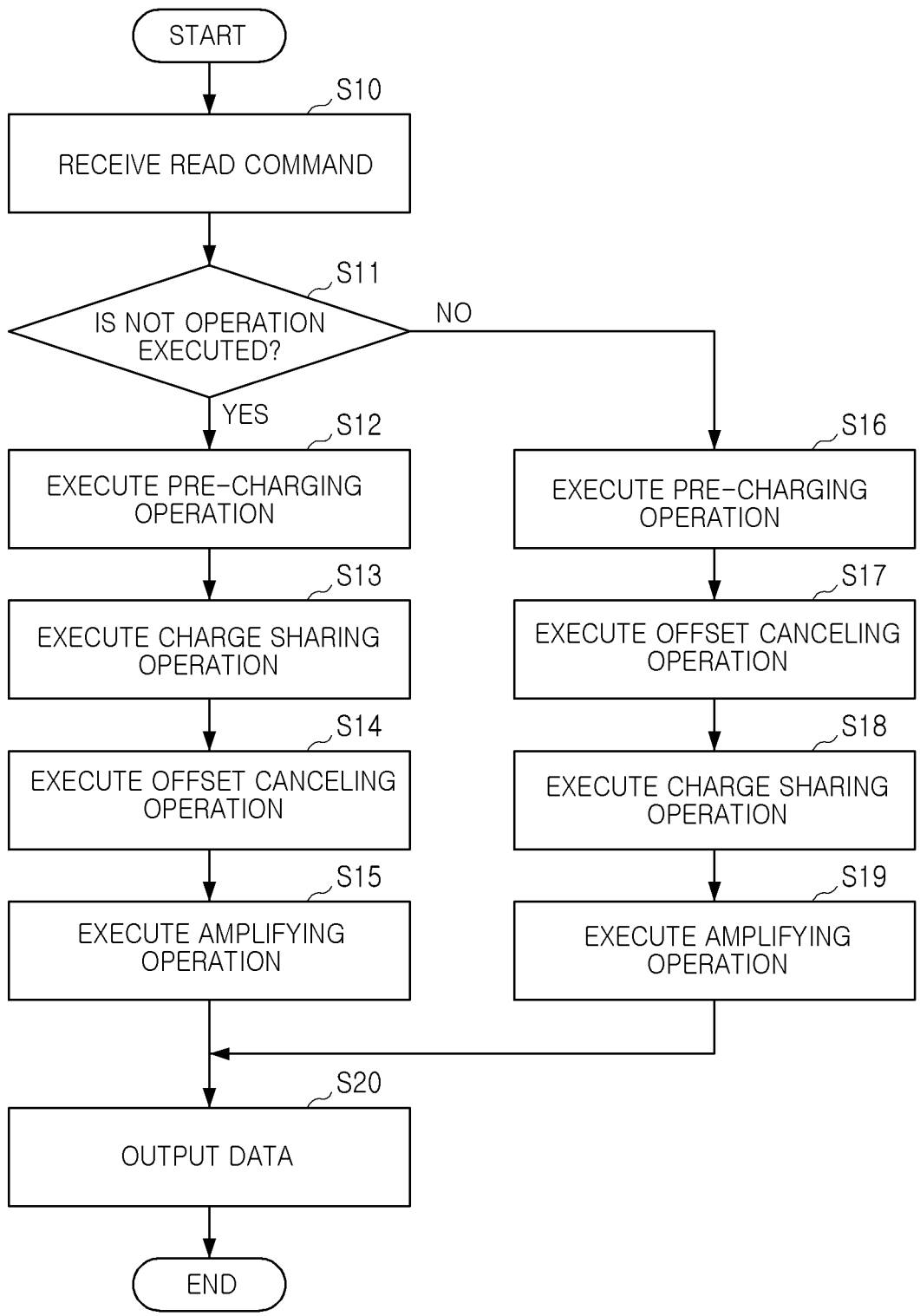
FIG. 7 is a flowchart illustrating an operation of a memory device according to an example embodiment.

FIG. 7 is a flowchart illustrating an operation of a memory device according to an example embodiment.

Referring to FIG. 7, an operation of the memory device according to an example embodiment may start by receiving a command by the memory device from an external host (S10). In an example embodiment, the command received by the memory device in S10 may include a read command and/or an operation command indicating an operation executable in the memory device. In addition, the memory device may receive an address necessary for selecting a memory cell from a memory cell array, together with the command.

When the memory device receives the read command in S10, the memory device may determine whether or not to execute a NOT operation (S11). When it is determined that the NOT operation needs to be executed by the read command as a determination result in S11, the memory device may execute S12 to S15 to obtain data and output the obtained data (S20). On the other hand, when it is determined in S11 that the NOT operation does not need to be executed, the memory device may execute S16 to S19 to obtain data and output the obtained data (S20).

When it is determined in S11 that the NOT operation needs to be executed, the memory device may execute a pre-charging operation of determining at least one selected memory cell from among memory cells of the memory cell array with reference to the received address and charging a bit line, a complementary bit line, a sensing bit line, a complementary sensing bit line, and the like, connected to the selected memory cell with a predetermined pre-charging voltage (e.g., $V_{PRE}$) (S12). When the pre-charging operation is completed, the memory device may execute a charge sharing operation (S13).

The charge sharing operation may include an operation of connecting a cell capacitor of the selected memory cell and the bit line connected to the selected memory cell to each other. A voltage of the bit line charged with the pre-charging voltage may be increased or decreased by the charge sharing operation. As an example, when data of the selected memory cell is '1', if the charge sharing operation is completed, the voltage of the bit line may be increased to be greater than the pre-charging voltage. On the other hand, when the data of the selected memory cell is '0', the voltage of the bit line may be decreased to be smaller than the pre-charging voltage by the charge sharing operation.

When the charge sharing operation is completed, the memory device may execute an offset canceling operation (S14). The offset canceling operation may include an operation in which a bit line sense amplifier connected to the selected memory cell connects the bit line to the complementary sensing bit line and connects the complementary bit line to the sensing bit line. A characteristic difference such as a threshold voltage difference between elements included in the bit line sense amplifier may be compensated for by the offset canceling operation.

In an example embodiment, the NOT operation may be executed by executing the offset canceling operation after completing the charge sharing operation. For example, when the data of the selected memory cell is '1', the voltage of the bit line may be higher than a voltage of the complementary bit line by the charge sharing operation. When the offset canceling operation is executed in this state, the voltage of the bit line may be decreased to be smaller than the voltage of the complementary bit line. Accordingly, the bit line sense amplifier may output the data of the selected memory cell as '0' rather than '1'.

When the offset canceling operation is completed, the memory device may execute an amplifying operation (S15). As an example, in the amplifying operation, the bit line sense amplifier may increase and/or decrease voltages of the sensing bit line and the complementary sensing bit line. For example, when the data of the selected memory cell is '1', the voltage of each of the complementary bit line and the complementary sensing bit line may be increased and the voltage of each of the bit line and the sensing bit line may be decreased, by the amplifying operation. The amplifying operation may include a pre-sensing operation and a restoring operation.

On the other hand, when it is determined in S11 that the NOT operation does not need to be executed, the memory device may execute a pre-charging operation of determining at least one selected memory cell from among memory cells of the memory cell array with reference to the received address and charging a bit line, a complementary bit line, a sensing bit line, a complementary sensing bit line, and the like, connected to the selected memory cell with a predetermined pre-charging voltage (S16).

When the pre-charging operation is completed, the memory device may sequentially execute an offset canceling operation and a charge sharing operation (S17 and S18). By executing the offset canceling operation prior to the charge sharing operation, the bit line sense amplifier may read and output data of the selected memory cell as it is. As an example, when the data of the selected memory cell is '1', if the charge sharing operation is completed, the voltage of the bit line may be increased to be greater than the pre-charging voltage. On the other hand, when the data of the selected memory cell is '0', the voltage of the bit line may be decreased to be smaller than the pre-charging voltage by the charge sharing operation.

When the charge sharing operation is completed, the memory device may execute an amplifying operation (S19). In the amplifying operation, the bit line sense amplifier may increase and/or decrease voltages of the sensing bit line and the complementary sensing bit line. For example, when the data of the selected memory cell is '1', the voltage of each of the bit line and the sensing bit line may be increased and the voltage of each of the complementary bit line and the complementary sensing bit line may be decreased, by the amplifying operation.

Figure 8:
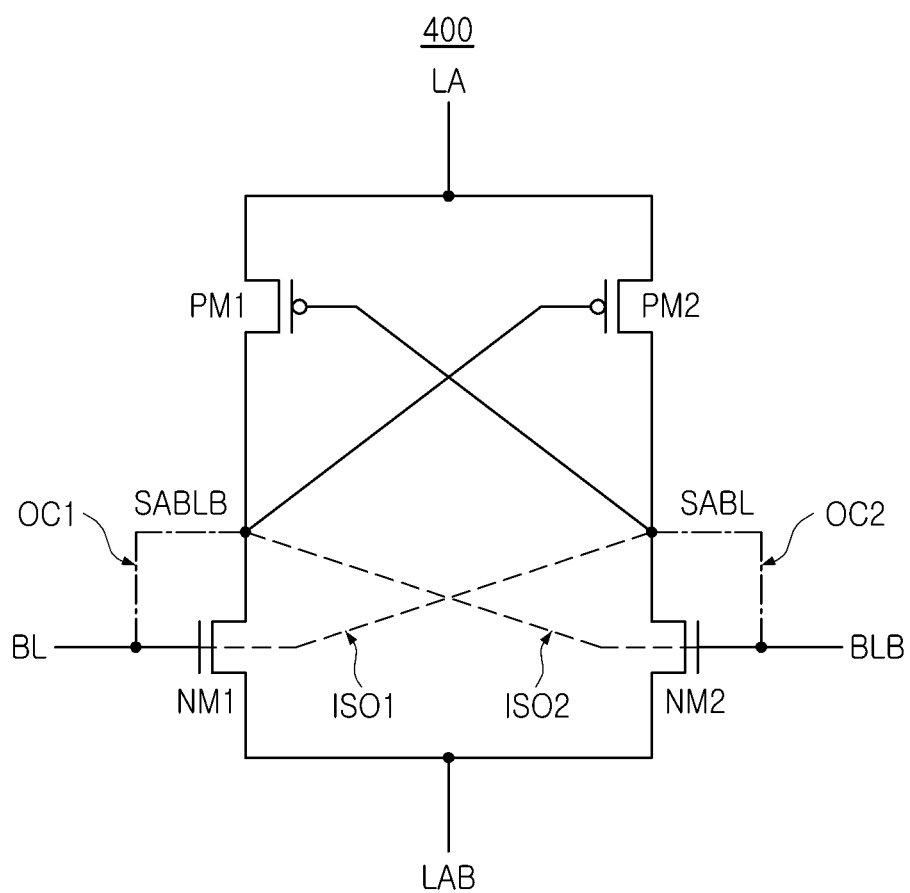
FIG. 8 is a schematic circuit diagram illustrating a bit line sense amplifier according to an example embodiment.

FIG. 8 is a schematic circuit diagram illustrating a bit line sense amplifier according to an example embodiment. FIGS. 9 to 13 are circuit diagrams provided in order to illustrate an operation of the bit line sense amplifier according to an example embodiment.

A bit line sense amplifier 400 according to an example embodiment may include a first PMOS element PM1, a second PMOS element PM2, a first NMOS element NM1, and a second NMOS element NM2. The first PMOS element PM1 and the first NMOS element NM1 may provide a first inverter, and the second PMOS element PM2 and the second NMOS element NM2 may provide a second inverter.

In addition, the bit line sense amplifier 400 may include a first offset element OC1, a second offset element OC2, and a first isolation element ISO1 and a second isolation element ISO2. In the circuit diagram illustrated in FIG. 8, the first offset element OC1, the second offset element OC2, the first isolation element ISO1, and the second isolation element ISO2 have been expressed in a dotted line form. The first PMOS element PM1 and the second PMOS element PM2 may receive a first sensing driving voltage LA, and the first NMOS element NM1 and the second NMOS element NM2 may receive a second sensing driving voltage LAB.

An operation of the bit line sense amplifier 400 will hereinafter be described with reference to FIGS. 9 to 13. In example embodiments illustrated in FIGS. 9 to 13, each of the first offset element OC1, the second offset element OC2, the first isolation element ISO1, and the second isolation element ISO2 has been illustrated with a solid line when it is turned on.

Figure 9:
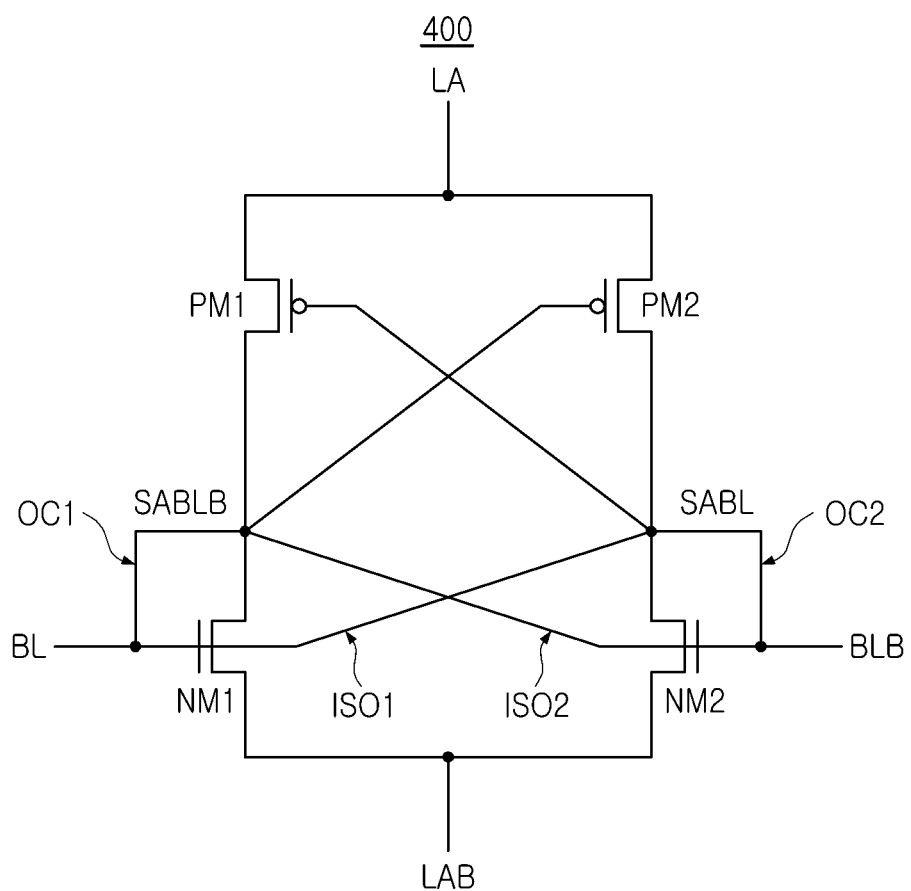
FIGS. 9 to 13 are circuit diagrams provided in order to illustrate an operation of the bit line sense amplifier according to an example embodiment.

First, FIG. 9 is an equivalent circuit diagram illustrating the bit line sense amplifier 400 while a pre-charging operation is being executed. During the pre-charging operation, the first offset element OC1, the second offset element OC2, the first isolation element ISO1, and the second isolation element ISO2 may be turned on. Accordingly, as illustrated in FIG. 9, in the bit line sense amplifier 400, a bit line BL and a complementary sensing bit line SABLB may be connected to each other, and a complementary bit line BLB and a sensing bit line SABL may be connected to each other. Thus, the bit line BL, the complementary bit line BLB, the sensing bit line SABL, and the complementary sensing bit line SABLB may be all connected to each other when the pre-charging operation is executed.

Figure 10:
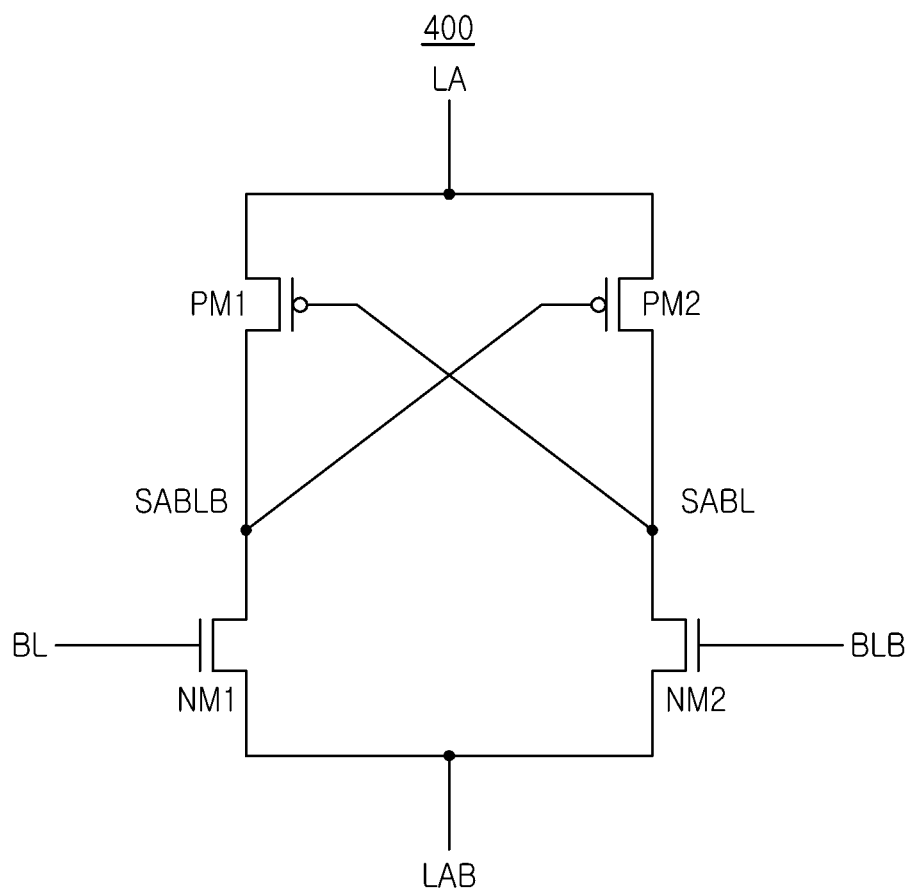

FIG. 10 is an equivalent circuit diagram illustrating the bit line sense amplifier 400 while a charge sharing operation is being executed. Referring to FIG. 10, during the charge sharing operation, the first offset element OC1, the second offset element OC2, the first isolation element ISO1, and the second isolation element ISO2 may be turned off.

In addition, while the charge sharing operation is being executed, in a selected memory cell connected to the bit line BL, a switch element of the selected memory cell may be turned on. Accordingly, a cell capacitor of the selected memory cell may be connected to the bit line BL, and the charge sharing operation may be executed. Depending on whether or not the cell capacitor is charged, a voltage of the bit line BL may be increased to be greater than a pre-charging voltage or decreased to be smaller than the pre-charging voltage. On the other hand, in a memory cell connected to the complementary bit line BLB, a switch element of the memory cell connected to the complementary bit line BLB may be maintained in a turn-off state, and accordingly, a voltage of the complementary bit line BLB may be maintained as the pre-charging voltage.

Figure 11:
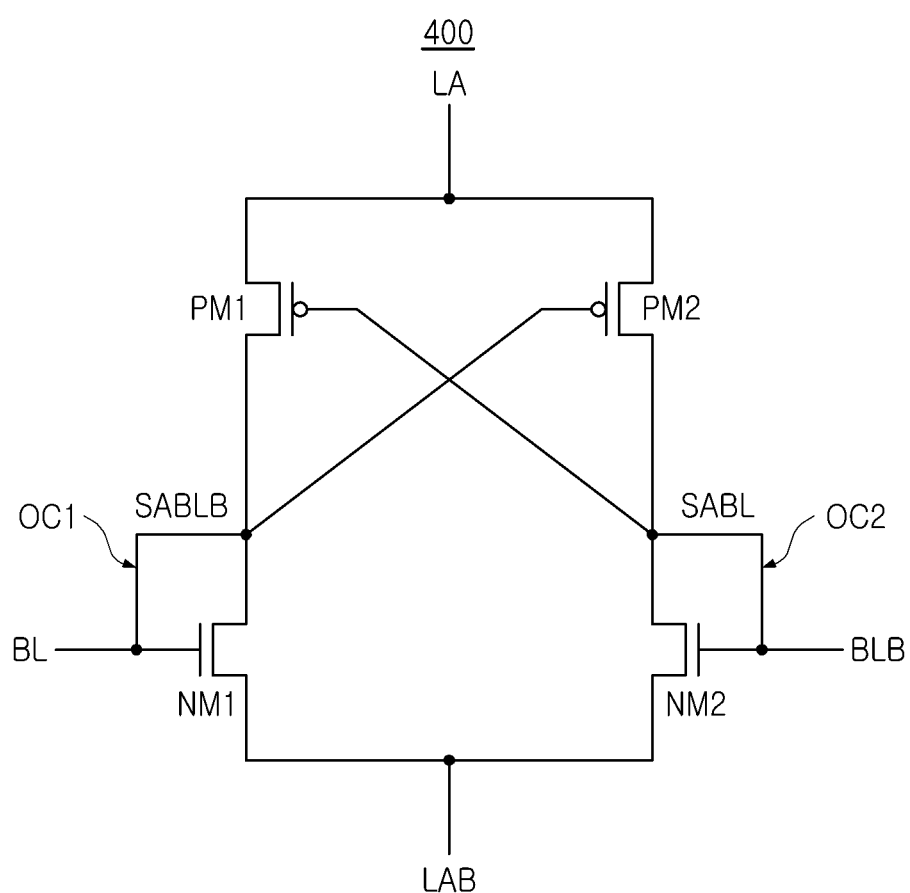

FIG. 11 is an equivalent circuit diagram illustrating the bit line sense amplifier 400 while an offset canceling operation is being executed. Referring to FIG. 11, during the offset canceling operation, the first offset element OC1 and the second offset element OC2 may be turned on, and the first isolation element ISO1 and the second isolation element ISO2 may be turned off. The first offset element OC1 and the second offset element OC2 are turned on, such that each of the first NMOS element NM1 and the second NMOS element NM2 may operate as a diode.

Figure 12:
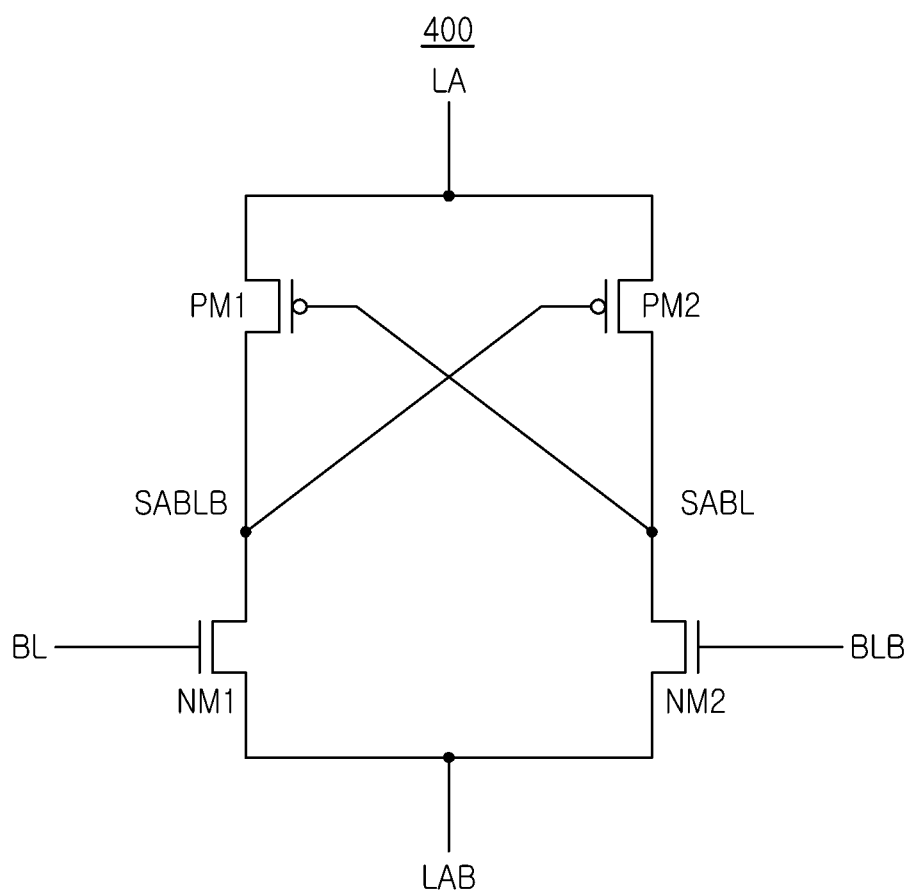

FIG. 12 is an equivalent circuit diagram illustrating the bit line sense amplifier 400 while a pre-sensing operation included in an amplifying operation is being executed. Referring to FIG. 12, during the pre-sensing operation, the first offset element OC1, the second offset element OC2, the first isolation element ISO1, and the second isolation element ISO2 may be turned off. The first offset element OC1, the second offset element OC2, the first isolation element ISO1, and the second isolation element ISO2 are turned off and the first sensing driving voltage LA and the second sensing driving voltage LAB are adjusted, such that the voltage of the sensing bit line SABL and the voltage of the complementary sensing bit line SABLB may be adjusted. As an example, when the pre-sensing operation is completed, a difference between the voltage of the sensing bit line SABL and the voltage of the complementary sensing bit line SABLB may increase.

Figure 13:
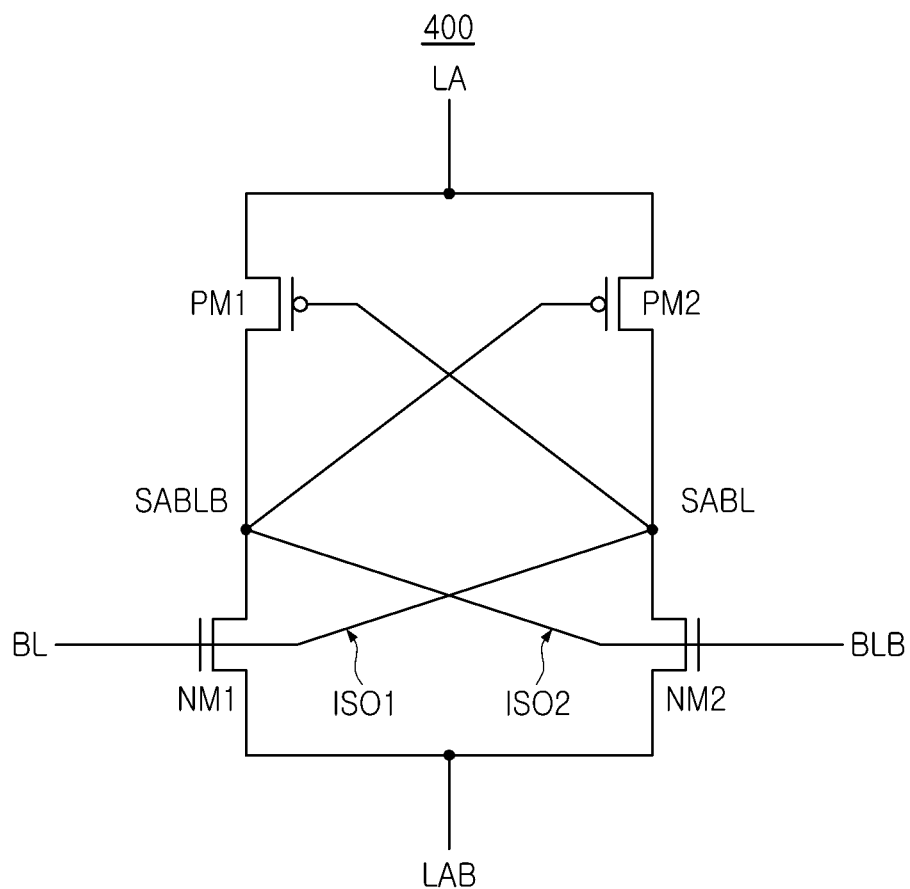

FIG. 13 is an equivalent circuit diagram illustrating the bit line sense amplifier 400 while a restoring operation included in the amplifying operation is being executed. Referring to FIG. 13, during the restoring operation, the first offset element OC1 and the second offset element OC2 may be turned off, and the first isolation element ISO1 and the second isolation element ISO2 may be turned on. Accordingly, the voltage of the bit line BL may follow the voltage of the sensing bit line SABL, and the voltage of the complementary bit line BLB may follow the voltage of the complementary sensing bit line SABLB.

Figure 14:
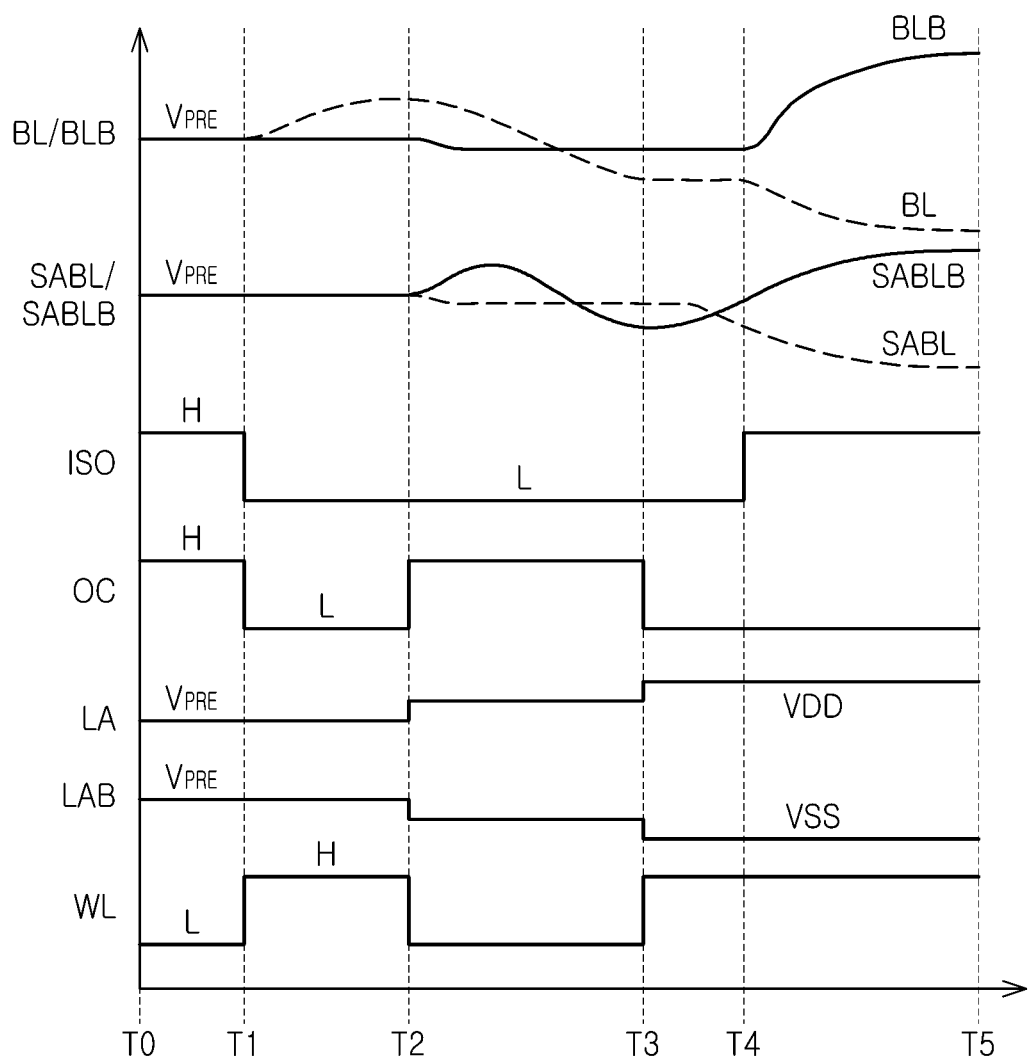
FIGS. 14 to 16 are waveform diagrams provided in order to illustrate an operation of the bit line sense amplifier according to an example embodiment.
Figure 15:
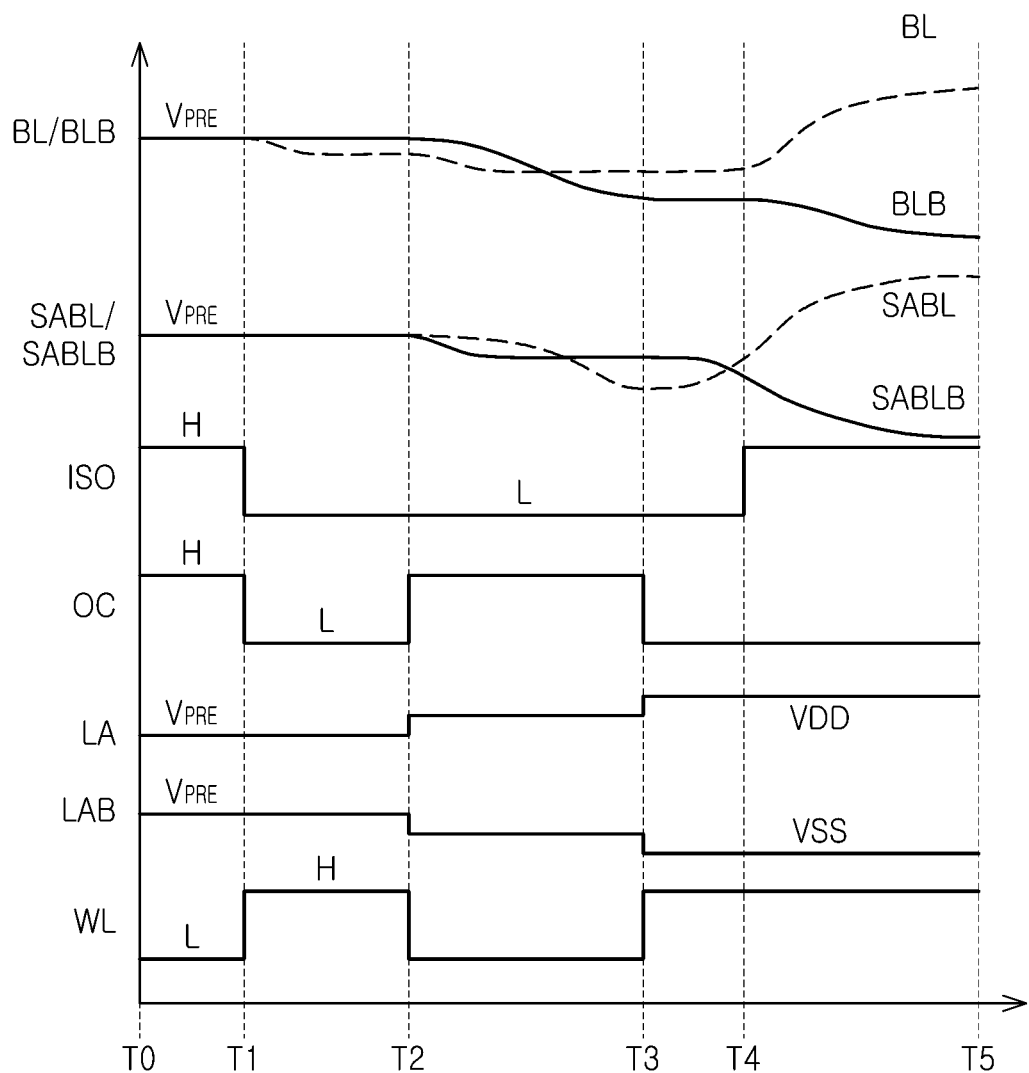
Figure 16:
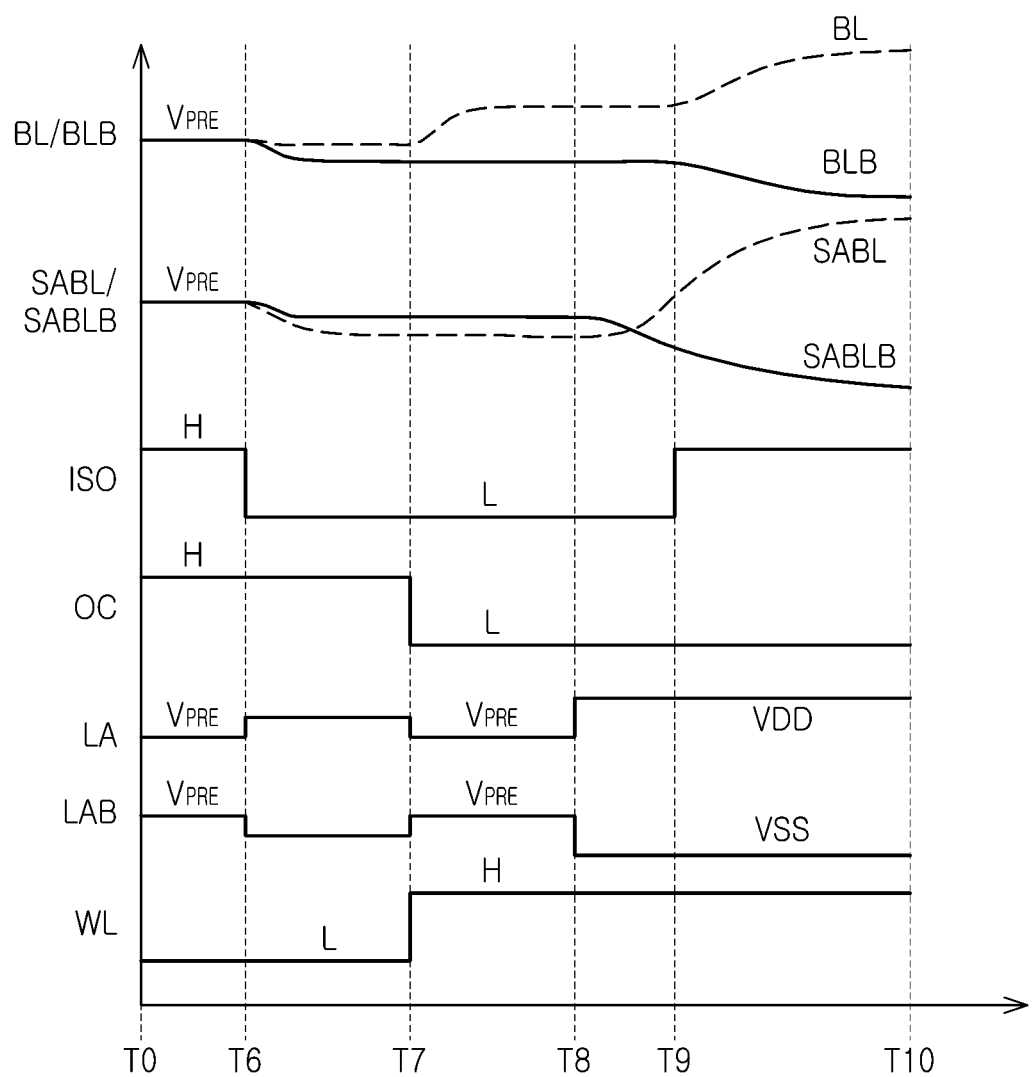

FIGS. 14 to 16 are waveform diagrams provided in order to illustrate an operation of the bit line sense amplifier according to an example embodiment.

An operation of the bit line sense amplifier 400 will hereinafter be described with reference to FIGS. 14 to 16 together with FIGS. 9 to 13 for convenience of explanation. FIGS. 14 and 15 may be waveform diagrams illustrating a first read operation in which a NOT operation is executed, and FIG. 16 may be a waveform diagram illustrating a second read operation in which the NOT operation is not executed.

First, FIG. 14 may be a waveform diagram illustrating the first read operation in which the NOT operation is executed when the data stored in the selected memory cell is '1'. Hereinafter, for convenience of explanation, it is assumed that the cell capacitor of the memory cell is charged when the data stored in the memory cell is '1' and the cell capacitor of the memory cell is not charged when the data stored in the memory cell is '0'.

Referring to FIG. 14, the pre-charging operation may be executed during a first pre-charging time T0 to T1, for example, a first time interval. During the first pre-charging time T0 to T1, the isolation control signal ISO and the offset cancellation signal OC may have a high logic H, and accordingly, as illustrated in FIG. 9, the first offset element OC1, the second offset element OC2, the first isolation element ISO1, and the second isolation element ISO2 may all be turned on. During the first pre-charging time T0 to T1, a voltage corresponding to a low logic L may be input to the word line WL connected to the selected memory cell, such that the cell capacitor of the selected memory cell may be electrically disconnected from the bit line BL. By the pre-charging operation, the bit line BL, the complementary sensing bit line SABLB, the complementary bit line BLB, and the sensing bit line SABL may be charged with the pre-charging voltage (e.g., $V_{PRE}$). In addition, the first sensing driving voltage LA and the second sensing driving voltage LAB may also have the pre-charging voltage $V_{PRE}$. Although not shown, the memory device may include one or more pre-charge and equalizer circuits configured to pre-charge the bit line BL, the complementary sensing bit line SABLB, the complementary bit line BLB, the sensing bit line SABL, the first sensing driving voltage LA and the second sensing driving voltage LAB.

Next, during a first charge sharing time T1 to T2, for example, a second time interval, the first offset element OC1, the second offset element OC2, the first isolation element ISO1, and the second isolation element ISO2 may all be turned off, and the charge sharing operation may be executed. During the first charge sharing time T1 to T2, a voltage corresponding to a high logic H may be input to the word line WL connected to the selected memory cell, such that the cell capacitor of the selected memory cell may be electrically connected to the bit line BL. In addition, the first sensing driving voltage LA and the second sensing driving voltage LAB may maintain the pre-charging voltage $V_{PRE}$. In an example embodiment illustrated in FIG. 14, the cell capacitor of the selected memory cell is in a charged state, and thus, the voltage of the bit line BL may be increased to be greater than the pre-charging voltage during the first charge sharing time T1 to T2.

When the charge sharing operation is completed, during a first offset canceling time T2 to T3, for example, a third time interval, the first offset element OC1 and the second offset element OC2 may be turned on and the first isolation element ISO1 and the second isolation element ISO2 may be turned off, such that the offset canceling operation may be executed. During the first offset canceling time T2 to T3, the first sensing driving voltage LA may have ¾ VDD and the second sensing driving voltage LAB may have ¼ VDD. For example, during the first offset canceling time T2 to T3, the PUDC 340 may generate the first sensing driving voltage LA having ¾ VDD, and PDDC 350 may generate the second sensing driving voltage LAB having ¼ VDD. In addition, the voltage corresponding to a low logic L may be input to the word line WL connected to the selected memory cell, such that the cell capacitor of the selected memory cell may be electrically disconnected from the bit line BL. During the first offset canceling time T2 to T3, as illustrated in FIG. 11, the bit line BL and the complementary sensing bit line SABLB may be connected to each other by turning on the first offset element OC1 and the complementary bit line BLB and the sensing bit line SABL may be connected to each other by turning on the second offset element OC2.

When the offset canceling operation is executed, the bit line BL having a relatively higher voltage at a second time point T2 may be discharged faster than the complementary bit line BLB. Accordingly, the voltage of the bit line BL may be decreased to be smaller than the voltage of the complementary bit line BLB during the first offset canceling time T2 to T3. In addition, the voltage of the complementary sensing bit line SABLB connected to the bit line BL may be decreased to be smaller than the voltage of the sensing bit line SABL connected to the complementary bit line BLB.

When the offset canceling operation is completed, the pre-sensing operation may be executed during a first pre-sensing time T3 to T4, for example, a fourth time interval. Referring to FIG. 12 illustrating the pre-sensing operation, the first offset element OC1, the second offset element OC2, the first isolation element ISO1, and the second isolation element ISO2 may all be turned off. During the first pre-sensing time T3 to T4, the voltage corresponding to a high logic H may be input to the word line WL connected to the selected memory cell, such that the cell capacitor of the selected memory cell may be electrically connected to the bit line BL, and the first sensing driving voltage LA may have the power supply voltage VDD and the second sensing driving voltage LAB may have the ground voltage VSS. For example, during the first pre-sensing time T3 to T4, the PUDC 340 may generate the first sensing driving voltage LA having the power supply voltage VDD, and PDDC 350 may generate the second sensing driving voltage LAB having the ground voltage VSS. During the first pre-sensing time T3 to T4, a magnitude relationship between the voltage of the sensing bit line SABL and the voltage of the complementary sensing bit line SABLB may be reversed again based on the voltages of the bit line BL and the complementary bit line BLB. Referring to FIG. 14, the voltage of the sensing bit line SABL may be decreased to be smaller than the voltage of the complementary sensing bit line SABLB.

During a first restoring time T4 to T5, for example, a fifth time interval, the first sensing driving voltage LA and the second sensing driving voltage LAB may be maintained as the power supply voltage VDD and the ground voltage VSS, respectively. Accordingly, the voltage of the sensing bit line SABL may be decreased to the ground voltage VSS, and the voltage of the complementary sensing bit line SABLB may be increased to the power supply voltage VDD. During the pre-charging operation, the first offset element OC1, the second offset element OC2, the first isolation element ISO1, and the second isolation element ISO2 may be turned on. When the pre-sensing operation is completed and the restoring operation is started, as illustrated in FIG. 13, the bit line BL may be connected to the sensing bit line SABL by turning on the first isolation element ISO1, and the complementary bit line BLB may be connected to the complementary sensing bit line SABLB by turning on the second isolation element ISO2. Accordingly, as illustrated in FIG. 14, during the first restoring time T4 to T5, the voltage of the bit line BL may be decreased to the ground voltage VSS and the voltage of the complementary bit line BLB may be increased to the power supply voltage VDD. As a result, even though the data stored in the selected memory cell is '1', the bit line sense amplifier 400 may output data '0'.

FIG. 15 may be a waveform diagram illustrating the first read operation in which the NOT operation is executed when the data stored in the selected memory cell is '0'. Referring to FIG. 15, the pre-charging operation may be executed during the first pre-charging time T0 to T1, and the charge sharing operation may be executed during the first charge sharing time T1 to T2. Since the cell capacitor of the selected memory cell is in a state in which it is not charged with charges, in an example embodiment illustrated in FIG. 15, the voltage of the bit line BL may be decreased below the voltage of the complementary bit line BLB by the charge sharing operation.

When the charge sharing operation is completed, the offset canceling operation may be executed by turning on the first offset element OC1 and the second offset element OC2 during the first offset canceling time T2 to T3. As described above, the relatively higher voltage of the complementary bit line BLB may be decreased faster than the voltage of the bit line BL by the offset canceling operation. Accordingly, as illustrated in FIG. 15, the voltage of the bit line BL and the voltage of the complementary bit line BLB may be reversed during the first offset canceling time T2 to T3.

Meanwhile, during the first offset canceling time T2 to T3, as illustrated in FIG. 11, the bit line BL and the complementary sensing bit line SABLB may be connected to each other by turning on the first offset element OC1 and the complementary bit line BLB and the sensing bit line SABL may be connected to each other by turning on the second offset element OC2. Accordingly, at a first offset canceling point in time T3, the voltage of the complementary sensing bit line SABLB may be greater than the voltage of the sensing bit line SABL.

Next, the pre-sensing operation may be executed during the first pre-sensing time T3 to T4. Referring to FIG. 12 illustrating the pre-sensing operation, the first offset element OC1, the second offset element OC2, the first isolation element ISO1, and the second isolation element ISO2 may all be turned off. The voltage of the sensing bit line SABL may be increased to be greater than the voltage of the complementary sensing bit line SABLB based on the voltages of the bit line BL and the complementary bit line BLB.

During the first restoring time T4 to T5, the first sensing driving voltage LA and the second sensing driving voltage LAB may be maintained as the power supply voltage VDD and the ground voltage VSS, respectively. Accordingly, the voltage of the sensing bit line SABL may be increased to the power supply voltage VDD, and the voltage of the complementary sensing bit line SABLB may be decreased to the ground voltage VSS. When the pre-sensing operation is completed and the restoring operation is started, as illustrated in FIG. 13, the bit line BL may be connected to the sensing bit line SABL, and the complementary bit line BLB may be connected to the complementary sensing bit line SABLB. Accordingly, as illustrated in FIG. 15, the voltage of the bit line BL may be increased to the power supply voltage VDD, and the voltage of the complementary bit line BLB may be decreased to the ground voltage VSS. As a result, even though the data stored in the selected memory cell is '0', the bit line sense amplifier 400 may output data '1'.

In the first read operation described with reference to FIGS. 14 and 15, the charge sharing operation may be executed prior to the offset canceling operation. Accordingly, in the charge sharing operation, a high logic H signal is input to the word line WL of the selected memory cell connected to the bit line BL, such that the cell capacitor of the memory cell is connected to the bit line BL, and the first offset element OC1 and the second offset element OC2 of the bit line sense amplifier 400 may be turned off, and in the offset canceling operation, a low logic L signal is input to the word line WL of the selected memory cell connected to the bit line BL, such that the cell capacitor of the memory cell is disconnected from the bit line BL, and the first offset element OC1 and the second offset element OC2 of the bit line sense amplifier 400 may be turned on.

Next, FIG. 16 may be a waveform diagram illustrating the second read operation in which the NOT operation is not executed when the data stored in the selected memory cell is '1'. As an example, the second read operation may be a general read operation in which the data of the selected memory cell is read from the memory device as it is.

Referring to FIG. 16, the pre-charging operation may be executed during a second pre-charging time T0 to T6, the offset canceling operation may be executed during a second offset canceling time T6 to T7, and the charge sharing operation may be executed during a second charge sharing time T7 to T8. For example, in the second read operation, the offset canceling operation may be executed prior to the charge sharing operation, unlike the first read operation in which the charge sharing operation is executed prior to the offset canceling operation.

The voltage of the bit line BL and the voltage of the complementary bit line BLB may be changed by the offset canceling operation during the second offset canceling time T6 to T7. In an example embodiment illustrated in FIG. 16, the voltage of the bit line BL may be greater than the voltage of the complementary bit line BLB at a point in time at which the offset canceling operation ends. As an example, a difference between the voltage of the bit line BL and the voltage of the complementary bit line BLB may correspond to a difference between threshold voltages of the first NMOS element NM1 and the second NMOS element NM2 included in the bit line sense amplifier 400. In the offset canceling operation, the bit line BL may be connected to the complementary sensing bit line SABLB by turning on the first offset element OC1, and the complementary bit line BLB may be connected to the sensing bit line SABL by turning on the second offset element OC2. In the offset canceling operation, the first sensing driving voltage LA may have ¾ VDD and the second sensing driving voltage LAB may have ¼ VDD.

When the charge sharing operation is executed, the first sensing driving voltage LA and the second sensing driving voltage LAB may be maintained at the pre-charging voltage $V_{PRE}$, and a voltage corresponding to a high logic H may be input to the word line WL connected to the selected memory cell, such that the cell capacitor of the selected memory cell may be connected to the bit line BL. Since the selected memory cell is in a state in which data '1' is stored therein, the voltage of the bit line BL may be increased.

Next, the pre-sensing operation may be executed during a second pre-sensing time T8 to T9, and the restoring operation may be executed during a second restoring time T9 to T10. The pre-sensing operation and the restoring operation may be similar to those described above with reference to FIGS. 14 and 15. Since the selected memory cell is in a state in which data '1' is stored therein, the voltages of the sensing bit line SABL and the bit line BL may be increased to the power supply voltage VDD, which is a voltage of the first sensing driving voltage LA, and the voltages of the complementary sensing bit line SABLB and the complementary bit line BLB may be decreased to the ground voltage VSS, which is a voltage of the second sensing driving voltage LAB. Since the voltage of the bit line BL is greater than the voltage of the complementary bit line BLB, the bit line sense amplifier 400 may output data '1'.

In the second read operation described with reference to FIG. 16, the offset canceling operation may be executed prior to the charge sharing operation. Accordingly, before a high logic H signal is input to the word line WL of the memory cell connected to the bit line BL, such that the cell capacitor of the memory cell is connected to the bit line BL, the first offset element OC1 and the second offset element OC2 of the bit line sense amplifier 400 may be turned on for the offset canceling operation.

As described above, in the memory device according to an example embodiment, the NOT operation may be implemented by executing the offset canceling operation behind the charge sharing operation in the bit line sense amplifier without a separate circuit or an additional circuit. Accordingly, the memory device capable of executing the NOT operation without decreasing a degree of integration may be provided.

In an example embodiment, the offset canceling operation may be executed after the charge sharing operation in the bit line sense amplifier in order to execute the NOT operation, and as described with reference to FIGS. 14 and 15, during the offset canceling operation, the voltage of the bit line BL and the voltage of the complementary bit line BLB may be reversed. Accordingly, a sufficient time may be allocated to the offset canceling operation so that the voltage of the bit line BL and the voltage of the complementary bit line BLB may be reversed, and a period of time required for the first read operation that includes the NOT operation may become longer than a period of time required for the second read operation that does not include the NOT operation.

In summary, in example embodiments described with reference to FIGS. 14 to 16, the first pre-charging time T0 to T1 may be substantially the same as the second pre-charging time T0 to T6, and the first charge sharing time T1 to T2 may be substantially the same as the second charge sharing time T7 to T8. However, the first offset canceling time T2 to T3 may be set to be longer than the second offset canceling time T6 to T7. Accordingly, a current flowing through the offset cancellation circuits including the offset elements OC1 and OC2 during the first offset canceling time T2 to T3 may be greater than a current flowing through the offset cancellation circuits including the offset elements OC1 and OC2 during the second offset canceling time T6 to T7.

Alternatively, in an example embodiment, in order to shorten the period of time required for the first read operation that includes the NOT operation, a plurality of offset elements connected to each other in parallel may be applied to the bit line sense amplifier. This will hereinafter be described in more detail with reference to FIG. 17.

Figure 17:
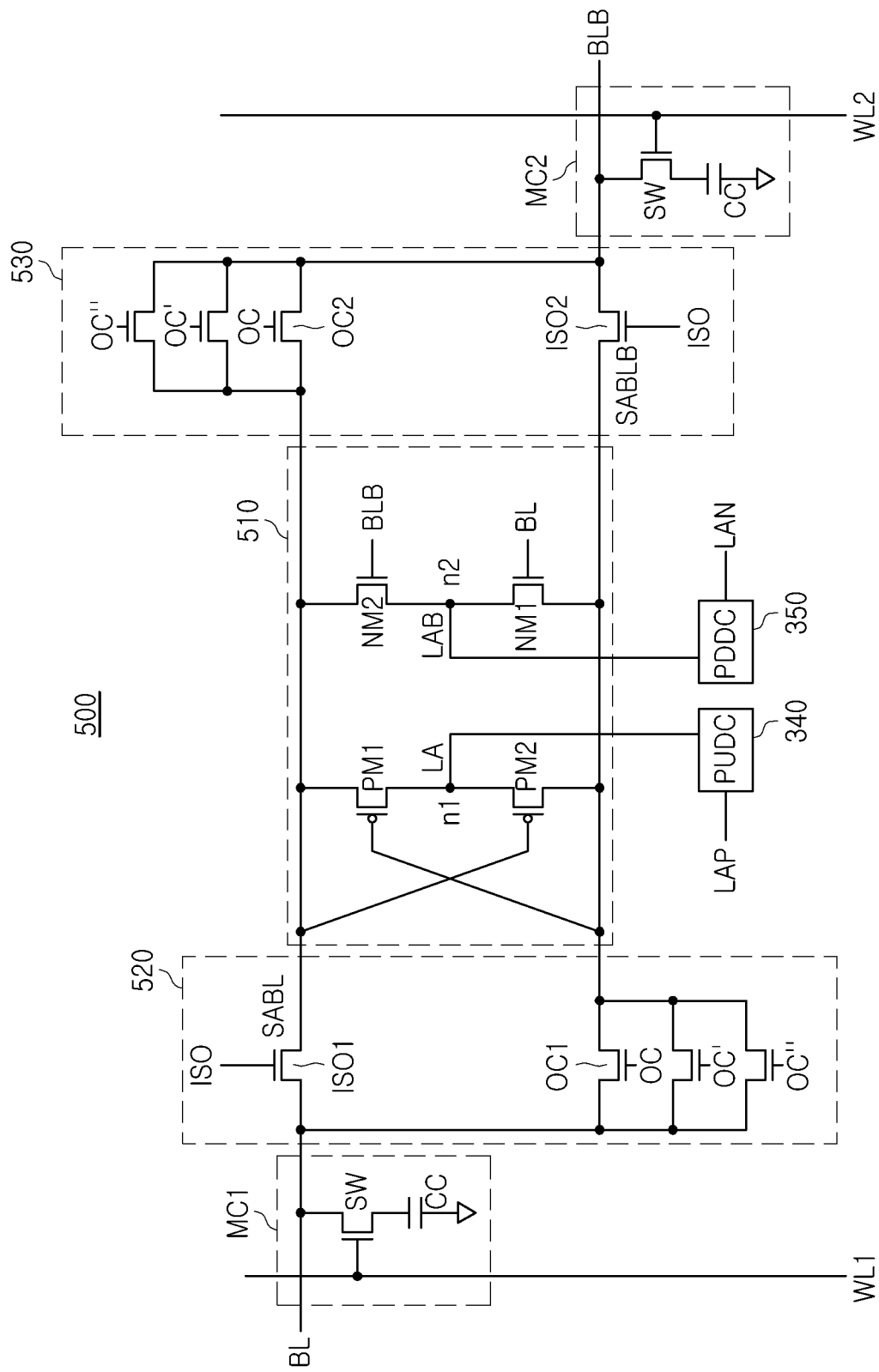
FIG. 17 is a schematic circuit diagram illustrating a bit line sense amplifier according to an example embodiment.

FIG. 17 is a schematic circuit diagram illustrating a bit line sense amplifier according to an example embodiment.

Referring to FIG. 17, a bit line sense amplifier 500 according to an example embodiment may include an amplifying circuit 510, a first offset cancellation circuit 520, a second offset cancellation circuit 530, and the like. A configuration of the amplifying circuit 510 may be similar to that described above with reference to FIG. 6.

The first offset cancellation circuit 520 may include a plurality of first offset elements OC1 and a first isolation element ISO1. The plurality of first offset elements OC1 may be connected to each other in parallel between a bit line BL and a complementary sensing bit line SABLB. Each of the plurality of first offset elements OC1 may be turned on in response to a plurality of offset cancellation signals OC, OC', and OC,'' respectively. The first isolation element ISO1 may be connected between the bit line BL and the sensing bit line SABL.

The second offset cancellation circuit 530 may include a plurality of second offset elements OC2 and a second isolation element ISO2. The plurality of second offset elements OC2 may be connected to each other in parallel between a complementary bit line BLB and the sensing bit line SABL. Each of the plurality of second offset elements OC2 may be turned on in response to the plurality of offset cancellation signals OC, OC', and OC,'' respectively. The second isolation element ISO2 may be connected between the complementary bit line BLB and the complementary sensing bit line SABLB.

By connecting the plurality of first offset elements OC1 to each other in parallel between the bit line BL and the complementary sensing bit line SABLB and connecting the plurality of second offset elements OC2 to each other in parallel between the complementary bit line BLB and the sensing bit line SABL, an amount of current flowing in the offset canceling operation may be increased as compared with the bit line sense amplifier 300 according to an example embodiment illustrated in FIG. 6. Accordingly, in the bit line sense amplifier 500 according to an example embodiment illustrated in FIG. 17, a period of time required for the first read operation that includes the NOT operation may be shortened. As an example, a period of time required for executing the first read operation in the bit line sense amplifier 500 may be substantially the same as a period of time required for executing the second read operation that does not include the NOT operation.

Although not shown, the PUDC 340 may include a plurality of PMOS elements connected to each other in parallel. Each of the plurality of plurality of PMOS elements may be turned on in response to the first sense amplifier enable signals LAP, respectively. The PDDC 350 may include a plurality of NMOS elements connected to each other in parallel. Each of the plurality of plurality of NMOS elements may be turned on in response to the second sense amplifier enable signals LAN, respectively.

In the PUDC 340 and the PDDC 350, by connecting the plurality of PMOS elements to each other in parallel and connecting the plurality of NMOS elements to each other in parallel, an amount of current flowing of the first and second inverts in the offset canceling operation may be increased as compared with the bit line sense amplifier 300 according to an example embodiment illustrated in FIG. 6. Accordingly, in the bit line sense amplifier 500 according to an example embodiment illustrated in FIG. 17, a period of time required for the first read operation that includes the NOT operation may be shortened. As an example, a period of time required for executing the first read operation in the bit line sense amplifier 500 may be substantially the same as a period of time required for executing the second read operation that does not include the NOT operation.

Figure 18A:
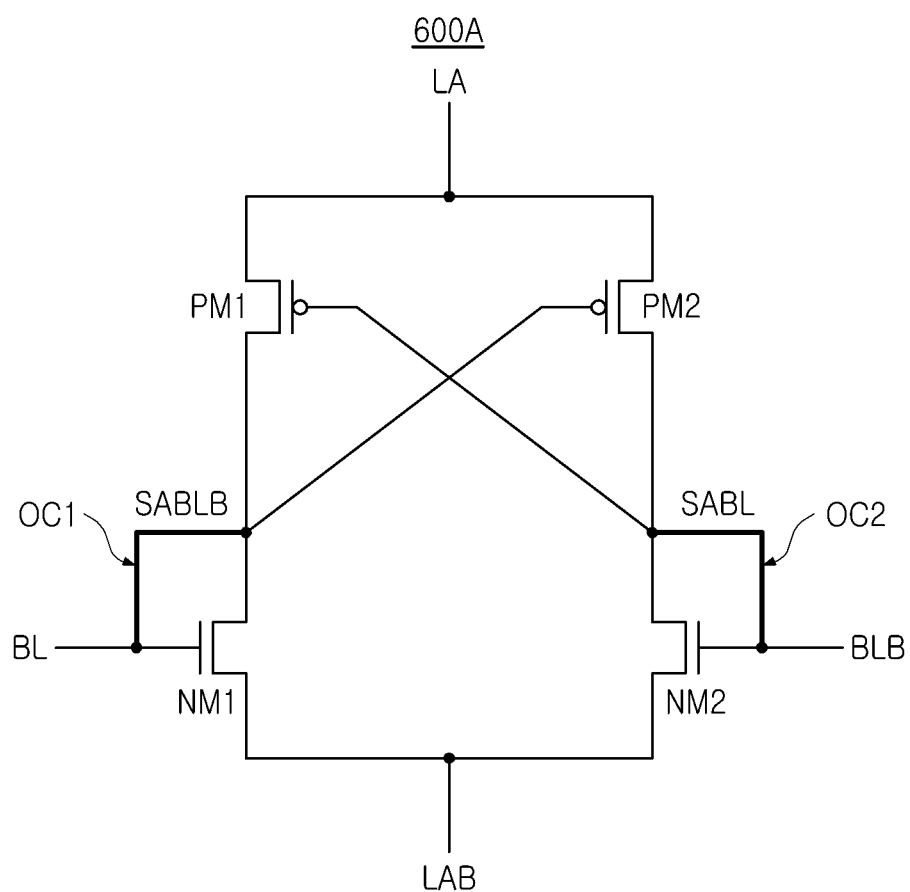
FIGS. 18A, 18B, and 19 are circuit diagrams provided in order to illustrate an operation of a bit line sense amplifier according to an example embodiment.
Figure 18B:
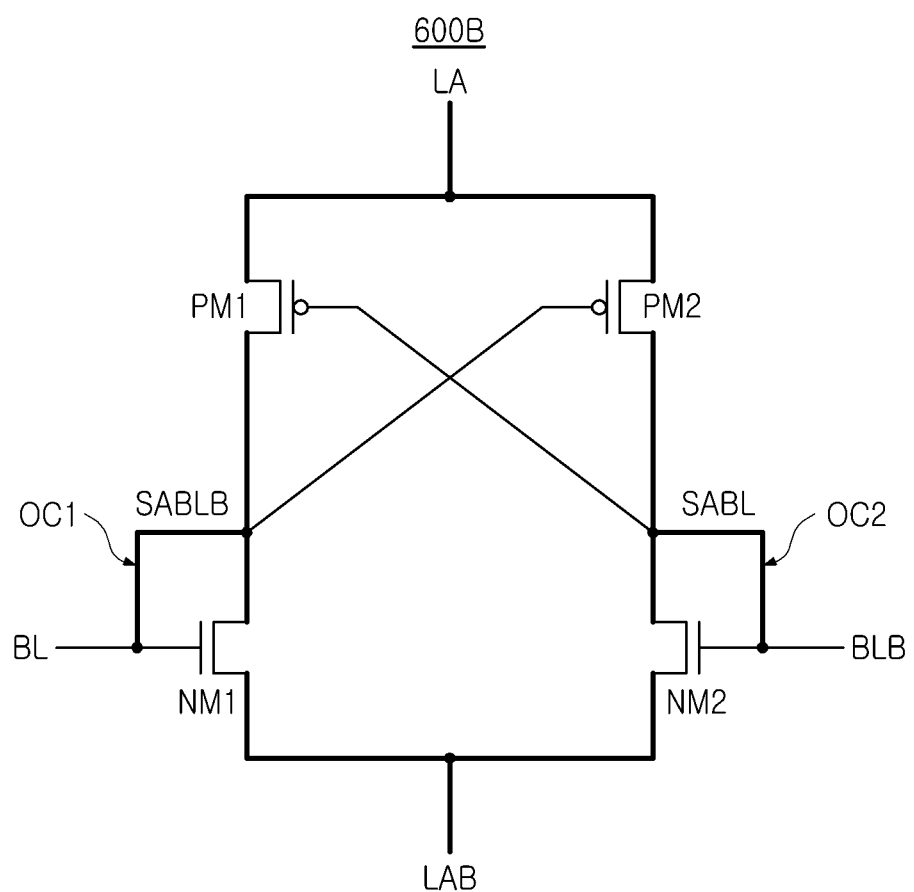
Figure 19:
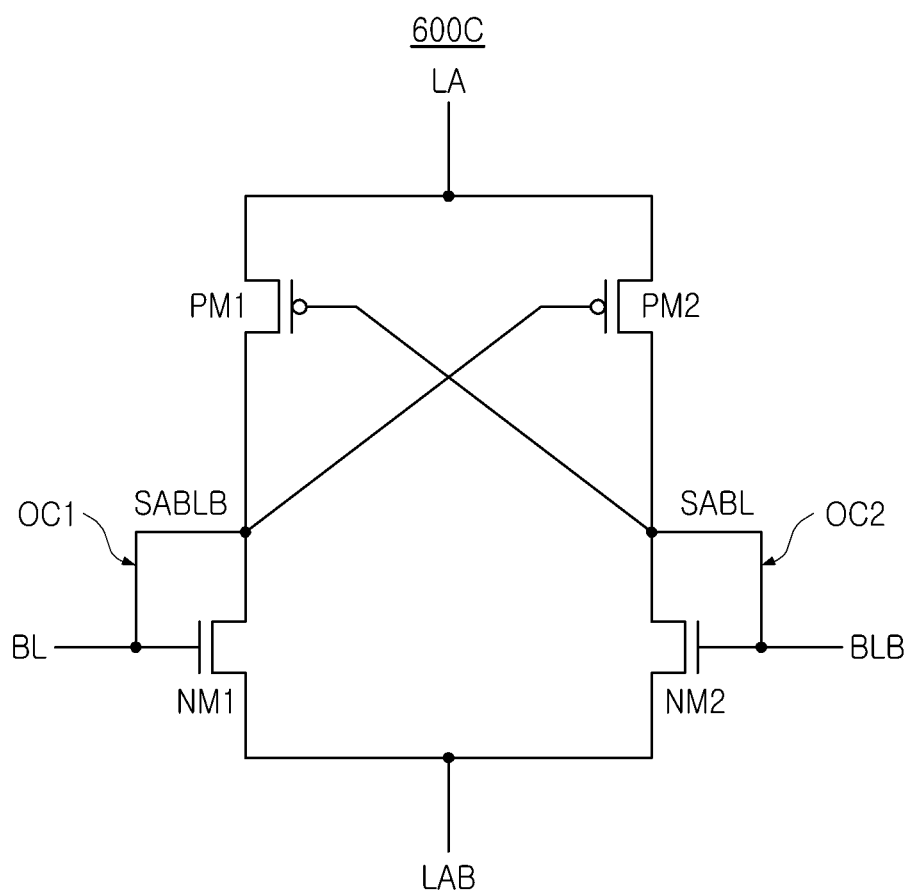

FIGS. 18A, 18B, and 19 are circuit diagrams provided in order to illustrate an operation of a bit line sense amplifier according to an example embodiment.

FIGS. 18A, 18B, and 19 may be circuit diagrams provided in order to an operation of a bit line sense amplifier while an offset canceling operation is being executed. Referring to FIGS. 18A, 18B, and 19, while an offset canceling operation is being executed, first and second offset elements OC1 and OC2 may be turned on and first and second sensing driving voltages LA and LAB may have ¾ VDD and ¼ VDD in each of bit line sense amplifiers 600A, 600B, and 600C. However, in an example embodiment illustrated in FIG.

18A, the bit line sense amplifier 600A may include a plurality of first offset elements OC1 connected to each other in parallel and a plurality of second offset elements OC2 connected to each other in parallel. In an example embodiment illustrated in FIG. 18B, the bit line sense amplifier 600B may include a plurality of PMOS elements in the PUDC 340 connected to each other in parallel and a plurality of NMOS elements in the PDDC 350 connected to each other in parallel. For example, an amplifying circuit (e.g., 310 in FIG. 6) of the bit line sense amplifier 600B may flow a great current during an offset canceling operation. Accordingly, a relatively great current may flow between a bit line BL and a complementary sensing bit line SABLB and between a complementary bit line BLB and a sensing bit line SABL while an offset canceling operation is being executed. The relatively great current flowing has been expressed in a thick line form as illustrated in FIGS. 18A and 18B.

On the other hand, in an example embodiment illustrated in FIG. 19, only one first offset element OC1 and one second offset element OC2 may be turned on, and only one PMOS element in the PUDC 340 and only one NMOS element in the PDDC 350 may be turned on in an offset canceling operation of the bit line sense amplifier 600C. Accordingly, a relatively small current may flow between a bit line BL and a complementary sensing bit line SABLB and between a complementary bit line BLB and a sensing bit line SABL.

As described above, in the first read operation that includes the NOT operation, the charge sharing operation may be executed prior to the offset canceling operation, and in the offset canceling operation, the voltage of the bit line BL and the voltage of the complementary bit line BLB may be reversed. In an example embodiment illustrated in FIG. 18A, a large amount of current may be made to flow through the plurality of first offset elements OC1 and the plurality of second offset elements OC2 and in an example embodiment illustrated in FIG. 18B, a large amount of current may be made to flow through the first and second inverts in the offset canceling operation, and thus, the voltage of the bit line BL and the voltage of the complementary bit line BLB may be reversed quickly while the offset canceling operation is being executed. Accordingly, as compared with an example embodiment illustrated in FIG. 19, the offset canceling operation may be completed more quickly, and a period of time required for the first read operation may be shortened.

In an example embodiment, the bit line sense amplifier may include a plurality of first offset elements OC1 connected to each other in parallel and a plurality of second offset elements OC2 connected to each other in parallel, and the number of offset elements OC1 and OC2 turned on in the offset canceling operation may be determined to be different from each other according to the first read operation and the second read operation. For example, in the first read operation in which the charge sharing operation is executed prior to the offset canceling operation, all of the plurality of first offset elements OC1 and the plurality of second offset elements OC2 may be turned on. On the other hand, in the second read operation in which the offset canceling operation is executed prior to the charge sharing operation, only one or some of the plurality of first offset elements OC1 and one or some of the plurality of second offset elements OC2 may be turned on.

In an example embodiment, the bit line sense amplifier may include the PUDC 340 including a plurality of PMOS elements connected to each other in parallel and the PDDC 350 including a plurality of NMOS elements connected to each other in parallel. The number of PMOS and NMOS elements turned on in the offset canceling operation may be determined to be different from each other according to the first read operation and the second read operation. For example, in the first read operation in which the charge sharing operation is executed prior to the offset canceling operation, all of the plurality of PMOS elements in the PUDC 340 may be turned on and all of the plurality of NMOS elements in the PDDC 350 may be turned on. On the other hand, in the second read operation in which the offset canceling operation is executed prior to the charge sharing operation, only one or some of the plurality of PMOS elements in the PUDC 340 may be turned on and one or some of the plurality of NMOS elements in the PDDC 350 may be turned on.

Figure 20:
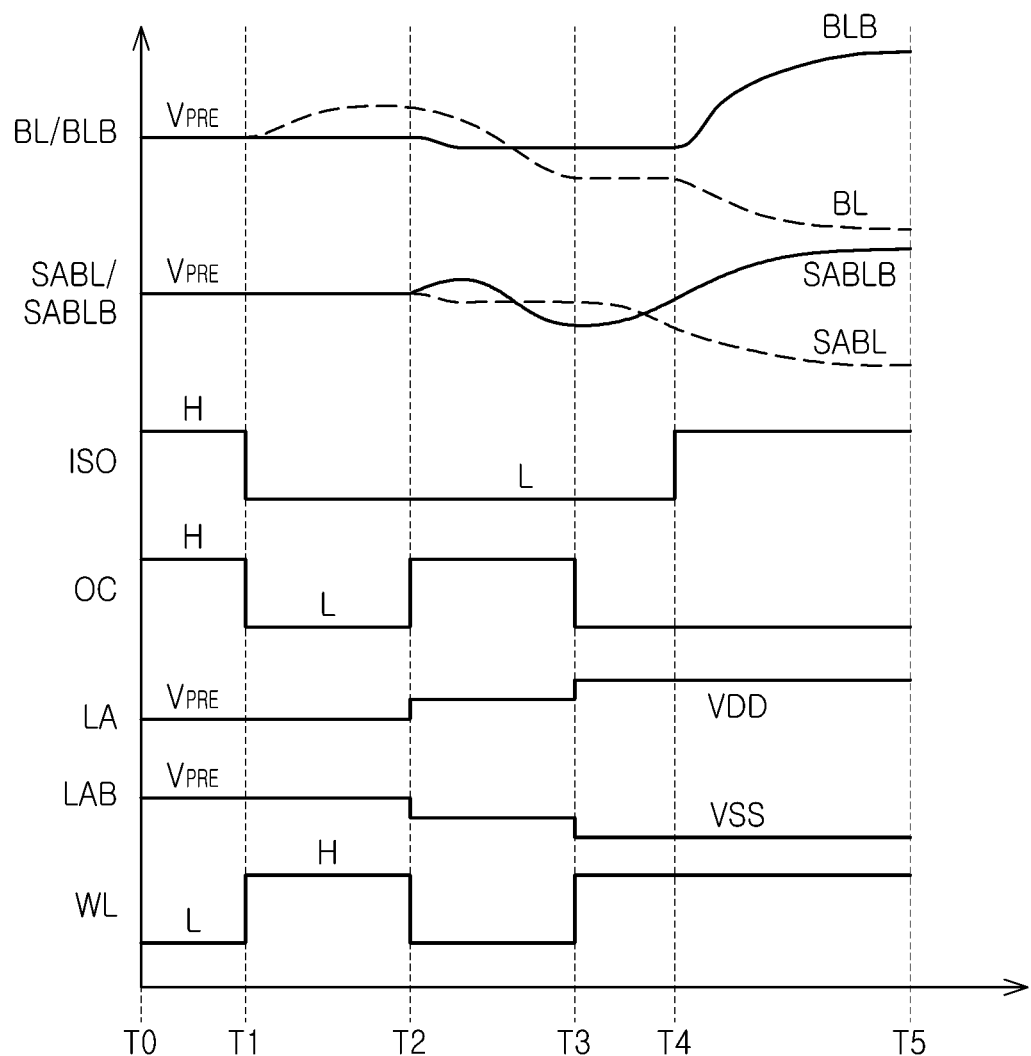
FIGS. 20 and 21 are waveform diagrams provided in order to illustrate an operation of the bit line sense amplifier according to an example embodiment.
Figure 21:
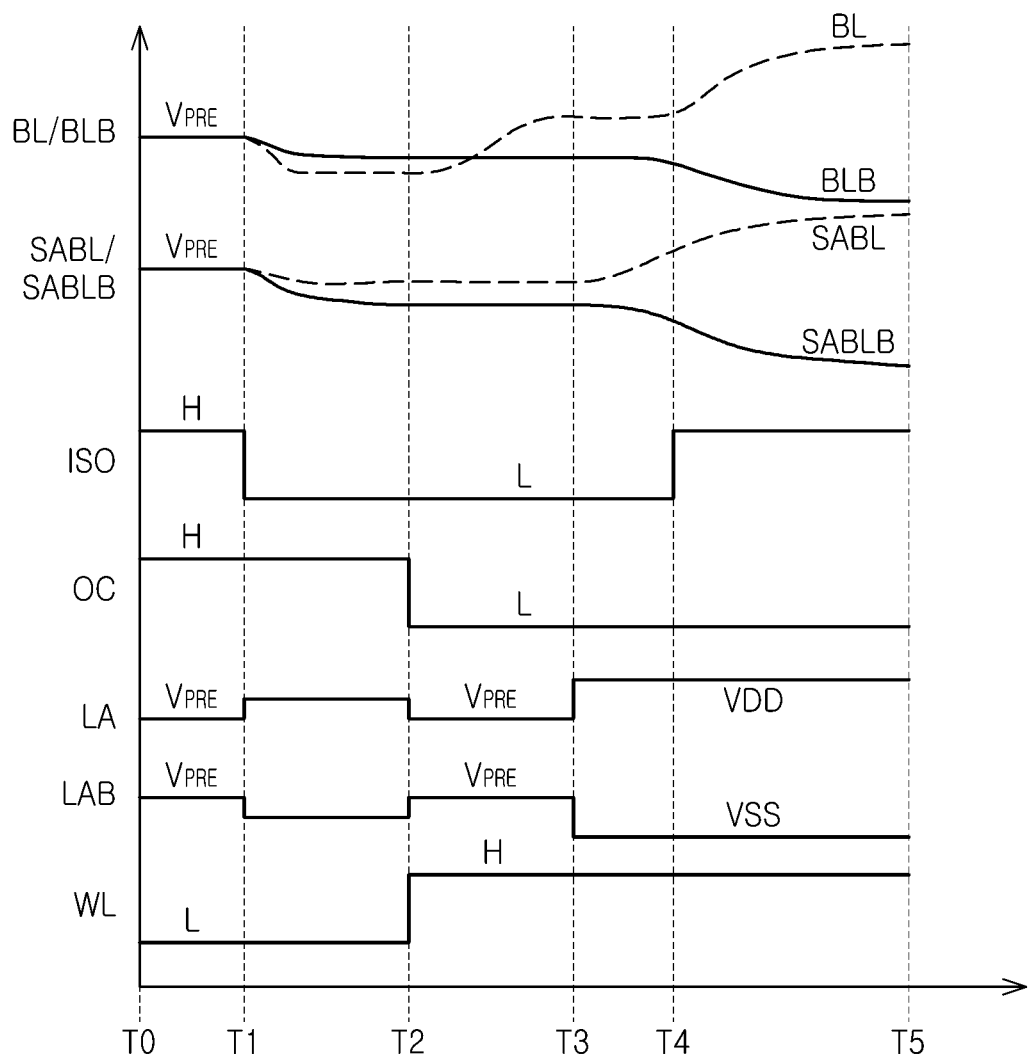

FIGS. 20 and 21 are waveform diagrams provided in order to illustrate an operation of the bit line sense amplifier according to an example embodiment.

FIG. 20 may be a waveform diagram illustrating a first read operation in which a NOT operation is executed, and FIG. 21 may be a waveform diagram illustrating a second read operation in which the NOT operation is not executed. In example embodiments described with reference to each of FIGS. 20 and 21, data stored in the selected memory cell connected to the bit line BL may be '1', and the cell capacitor of the selected memory cell may be in a charged state.

Referring to FIG. 20, the pre-charging operation may be executed during a first time T0 to T1, and the bit line BL, the complementary sensing bit line SABLB, the complementary bit line BLB, and the sensing bit line SABL may be charged with a pre-charging voltage $V_{PRE}$. Next, during a second time T1 to T2, the charge sharing operation may be executed, such that the bit line BL may be connected to the cell capacitor of the selected memory cell, and a voltage of the bit line BL may be increased to be greater than the pre-charging voltage $V_{PRE}$ by charges of the cell capacitor.

When the charge sharing operation is completed, the offset canceling operation may be executed during a third time T2 to T3. During the third time T2 to T3, the bit line BL and the complementary sensing bit line SABLB may be connected to each other and the complementary bit line BLB and the sensing bit line SABL may be connected to each other.

The bit line sense amplifier of which an operation is described with reference to FIG. 20 may include a plurality of first offset elements connected to each other in parallel and a plurality of second offset elements connected to each other in parallel, and/or may include a plurality of PMOS elements in the PUDC 340 connected to each other in parallel and a plurality of NMOS elements in the PDDC 350 connected to each other in parallel. Accordingly, a relatively large amount of current may flow through the plurality of first offset elements and the plurality of second offset elements or a relatively large amount of current may flow through the first and second inverts, during the offset canceling operation, and as illustrated in FIG. 20, the voltage of the bit line BL and the voltage of the complementary bit line (BLB) may be reversed quickly. Meanwhile, at a third point in time T3 when the offset canceling operation ends, the voltage of the sensing bit line SABL may be greater than the voltage of the complementary sensing bit line SABLB.

When the offset canceling operation is completed, the pre-sensing operation may be executed during a fourth time T3 to T4, and the restoring operation may be executed during a fifth time T4 to T5. The offset cancellation signal OC may be changed to a low logic L, such that the bit line BL and the complementary sensing bit line SABLB may be disconnected from each other and the complementary bit line BLB and the sensing bit line SABL may be disconnected from each other, and accordingly, the voltage of the complementary sensing bit line SABLB may be increased to be greater than the voltage of the sensing bit line SABL.

During the fourth time T3 to T4 and the fifth time T4 to T5, the first sensing driving voltage LA and the second sensing driving voltage LAB may be maintained as the power supply voltage VDD and the ground voltage VSS, respectively. Accordingly, the voltage of the sensing bit line SABL may be decreased to the ground voltage VSS, and the voltage of the complementary sensing bit line SABLB may be increased to the power supply voltage VDD. When the pre-sensing operation is completed and the restoring operation is started, the bit line BL may be connected to the sensing bit line SABL, and the complementary bit line BLB may be connected to the complementary sensing bit line SABLB in response to turning on the first and second isolation elements ISO1 and ISO2. Accordingly, as illustrated in FIG. 20, due to the restoring operation, the voltage of the bit line BL may be decreased to the ground voltage VSS and the voltage of the complementary bit line BLB may be increased to the power supply voltage VDD. Even though the data stored in the selected memory cell is '1', the bit line sense amplifier may output data '0'.

Next, referring to FIG. 21, the pre-charging operation may be executed during a first time T0 to T1, the offset canceling operation may be executed during a second time T1 to T2, and the charge sharing operation may be executed during a third time T2 to T3. In the second read operation, the offset canceling operation may be executed prior to the charge sharing operation, unlike the first read operation in which the charge sharing operation is executed prior to the offset canceling operation. Next, the pre-sensing operation may be executed for a fourth time T3 to T4, the restoring operation may be executed for a fifth time T4 to T5, and the bit line sense amplifier may output data '1'.

The bit line sense amplifier according to example embodiments described with reference to FIGS. 20 and 21 may include a plurality of first offset elements and a plurality of second offset elements and/or may include a plurality of PMOS elements in the PUDC 340 connected to each other in parallel and a plurality of NMOS elements in the PDDC 350 connected to each other in parallel. Accordingly, the third time T2 to T3 of FIG. 20 does not need to be allocated to be long in order for the voltage of the bit line BL and the voltage of the complementary bit line BLB to be reversed, by the offset canceling operation in the first read operation. For example, the second time T1 to T2 of FIG. 20 may be the same as the third time T2 to T3 of FIG. 21, and the third time T2 to T3 of FIG. 20 may be the same as the second time T1 to T2 of FIG. 21. Accordingly, a total period of time T0 to T5 required for the first read operation and a total period of time T0 to T5 required for the second read operation may be the same as each other. As a result, the NOT operation may be implemented only with the bit line sense amplifier without a time delay as well as a separately added circuit.

Figure 22:
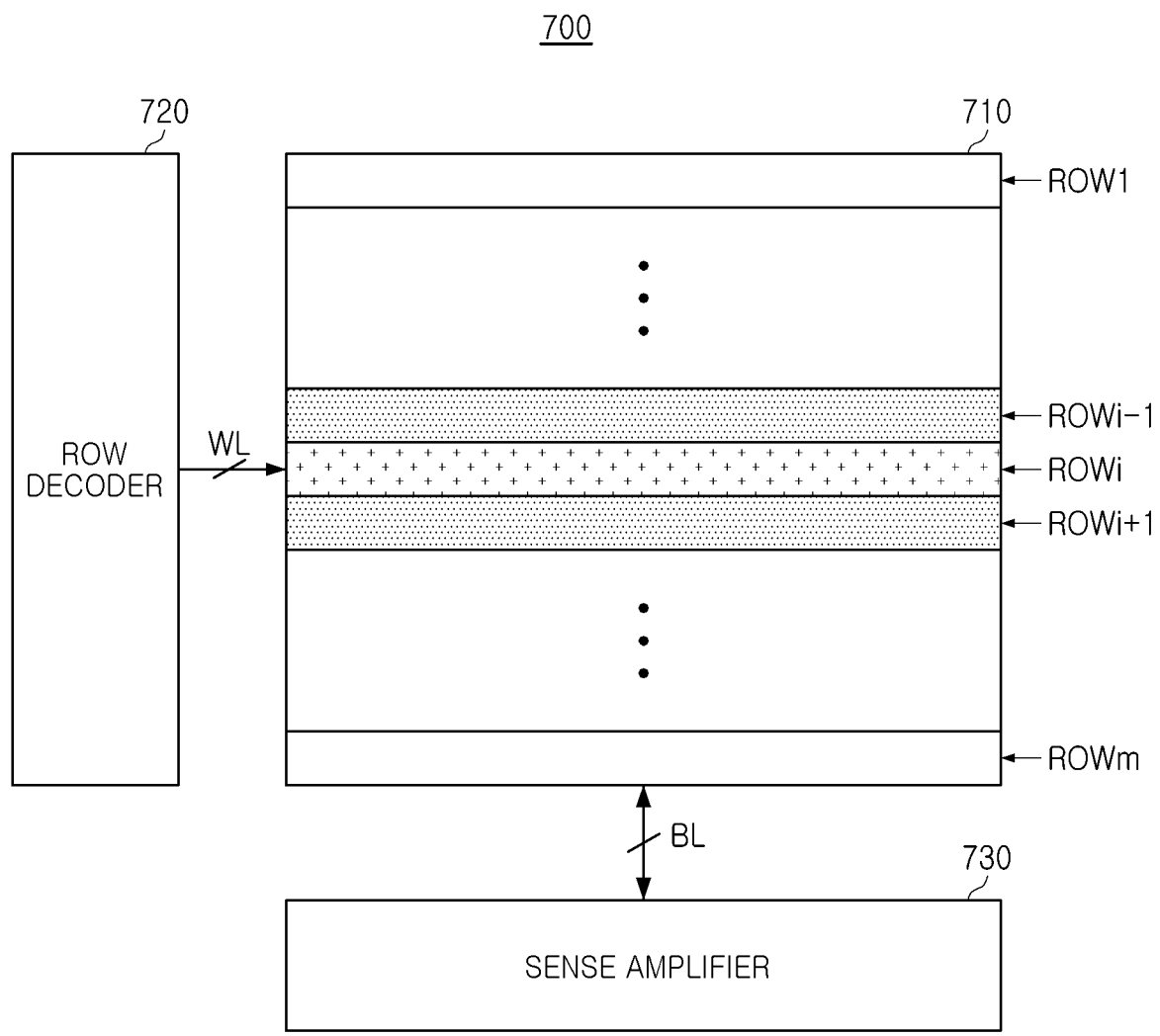
FIG. 22 is a block diagram provided in order to illustrate an operation of a memory device according to an example embodiment.

FIG. 22 is a block diagram provided in order to illustrate an operation of a memory device according to an example embodiment.

Referring to FIG. 22, a memory device 700 according to an example embodiment may include a memory cell array 710, a row decoder 720, a sense amplifier 730, and the like. The row decoder 720 may be connected to the memory cell array 710 through a plurality of word lines WL, and the sense amplifier 730 may be connected to the memory cell array 710 through a plurality of bit lines BL. The sense amplifier 730 may include a plurality of bit line sense amplifiers connected to the plurality of bit lines BL. Meanwhile, a plurality of memory cells included in the memory cell array 710 may be arranged along a plurality of rows ROW1 to ROWm, and the plurality of rows ROW1 to ROWm may correspond to the plurality of word lines WL.

In the memory device 700, when a row hammer phenomenon in which continuous or intensive access to only a specific row of the plurality of rows ROW1 to ROWm occurs arises, a problem that data of memory cells connected to other adjacent rows are changed may arise. As an example, the row to which the continuous access occurs may be defined as an aggressor row ROWi, and other rows adjacent to the aggressor row ROWi are defined as victim rows ROWi-1 and ROWi+1. Referring to FIG. 22, access to memory cells connected to the aggressor row ROWi is repeated, such that data of memory cells connected to the adjacent victim rows ROWi-1 and ROWi+1 may be unintentionally changed.

In an example embodiment, the problem as described above may be minimized by changing bits of data stored in the memory cells connected to the aggressor row ROWi to which the access is repeated and storing the data of which the bits are changed. In this case, the fact that the data of the memory cells connected to the aggressor row ROWi is bit-flipped and stored may be recorded in other memory cells. This will hereinafter be described in more detail with reference to FIG. 23.

Figure 23:
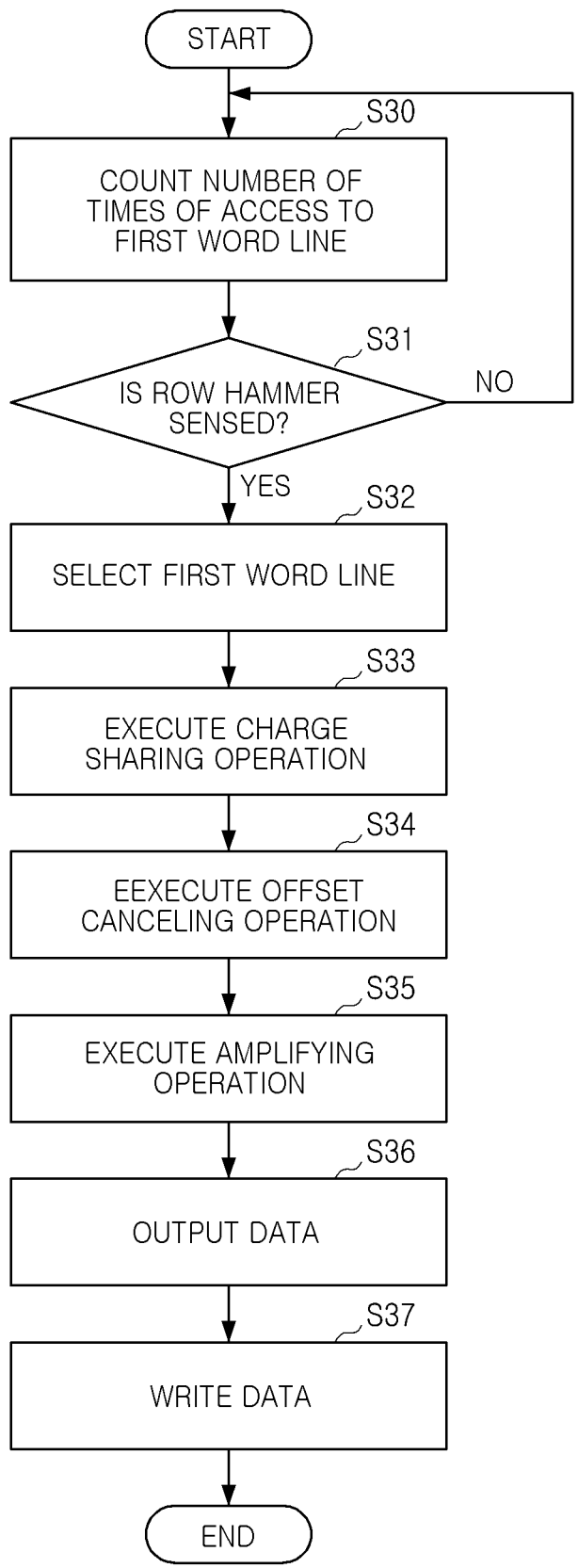
FIG. 23 is a flowchart illustrating an operation of the memory device according to an example embodiment.

FIG. 23 is a flowchart illustrating an operation of the memory device according to an example embodiment.

Referring to FIG. 23, an operation of the memory device according to an example embodiment may start by counting the number of times of access to a first word line (S30). As an example, the memory device may determine whether or not row hammer occurs by counting the number of times of access to word lines corresponding to rows of the memory cell array. The memory device may count the number of times of access to the first word line when access to a specific word line, for example, the first word line, of the word lines is repeated.

The row hammer may be sensed by comparing the number of times of the access to the first word line with a predetermined reference number of times (S31). When the row hammer is sensed in S31, the memory device may select the first word line to which the access has occurred more than the predetermined reference number of times (S32), and execute a read operation for memory cells connected to the first word line. The read operation executed here may be the first read operation described above.

In order to execute the first read operation, the memory device may sequentially execute a charge sharing operation, an offset canceling operation, and an amplifying operation in each of bit line sense amplifiers connected to bit lines crossing the first word line (S33 to S35). Accordingly, the bit line sense amplifiers may bit-flip and output data stored in the memory cells connected to the first word line (S36). As an example, when the data stored in the memory cell is '0', the bit line sense amplifier may output '1', and when the data stored in the memory cell is '1', the bit line sense amplifier may output '0'.

When the bit line sense amplifiers bit-flip and output the data of the memory cells connected to the first word line, the memory device may write the obtained data again to the memory cells connected to the first word line (S37). Accordingly, the data of the memory cells connected to the first word line may be bit-flipped and stored, and data of memory cells connected to other word lines adjacent to the first word line may be prevented from being unintentionally changed due to the row hammer.

Figure 24A:
FIGS. 24A and 24B are diagrams provided in order to illustrate an operation of the memory device according to an example embodiment.
Figure 24B:

FIGS. 24A and 24B are diagrams provided in order to illustrate an operation of the memory device according to an example embodiment.

The memory device according to an example embodiment may support a data bus inversion (DBI) function in order to decrease power consumption in exchanging data. As an example, the memory device may output data in units of 8 bits, and may decrease power consumption by inverting each of bits included in the data and transmitting the data in which each of the bits is inverted when the number of 1 s is 5 or more. Herein, the memory device may output data of 8 bits through the data signal DQ of FIG. 1. In some examples, depending on a circuit configuration of a path through which the memory device transmits the data, the memory device may also invert each of the bits of 8-bit data when the number of 0s is 5 or more in order to decrease power consumption.

Referring to FIG. 24A, first data 801 may be data of [10100001]. Three bits of eight bits included in the first data 801 may be '1', and the other five bits of the eight bits may be '0'. Accordingly, the memory device may generate first output data 801A without inverting each of the bits of the first data 801. The first output data 801A may further include DBI data indicating whether or not bits have been inverted, in addition to the 8-bit data included in the first data 801. The DBI data may be 1-bit data, and in the example embodiment illustrated in FIG. 24A, the bits of the first data 801 are not inverted, and the DBI data may thus be '0'.

Next, referring to FIG. 24B, second data 802 may be data of [01110110]. Five bits of eight bits included in the second data 802 may be '1', and the other three bits of the eight bits may be '0'. Accordingly, the memory device may generate second output data 802A by inverting each bit of the second data 802. The second output data 802A may further include DBI data indicating whether or not bits have been inverted, in addition to the 8-bit data included in the second data 802, and in an example embodiment illustrated in FIG. 24B, the DBI data may thus be '1'.

In the operation of the memory device described with reference to FIGS. 24A and 24B, the inversion of the bits of the data may be executed by the bit line sense amplifier rather than a separate or an additional circuit. As described above, in the memory device according to an example embodiment, the bit line sense amplifier may execute the first read operation including the NOT operation of inverting the bits by executing the charge sharing operation prior to the offset canceling operation. Accordingly, the memory device according to an example embodiment may implement the DBI function without a separate or an additional circuit for supporting DBI only by controlling the bit line sense amplifier to execute the charge sharing operation prior to the offset canceling operation.

FIGS. 25A, 25B, 26A, and 26B are diagrams provided in order to illustrate an operation of the memory device according to an example embodiment.

Figure 25A:
FIGS. 25A, 25B, 26A, and 26B are diagrams provided in order to illustrate an operation of the memory device according to an example embodiment.
Figure 25B:

In an example embodiment illustrated in FIGS. 25A and 25B, the memory device may control the bit line sense amplifier to execute the first read operation including the NOT operation in order to minimize a bit difference between consecutively transmitted data. First, referring to FIG. 25A illustrating Comparative Example, first data 811 transmitted by the memory device in a first period may be [00000000] as 8-bit data, and second data 812 transmitted by the memory device in a second period following the first period may be [11111111]. When the first data 811 and the second data 812 are consecutively transmitted as they are, all bits in the 8-bit data need to be changed from 0 to 1, and signal to noise ratio (SNR) characteristic of a signal may thus be deteriorated.

In an example embodiment, as illustrated in FIG. 25B, the deterioration of the SNR characteristic of the signal may be minimized by adding 1-bit DBI data to 8-bit data to be transmitted, and inverting at least some of the bits of the 8-bit data and transmitting the data of which at least some of the bits are inverted, if necessary. Referring to FIG. 25B, first data 813 transmitted in a first period may be [00000000] as illustrated in FIG. 25A. In this case, bits of the first data 813 are not inverted, and DBI data may thus be '0'.

In an example embodiment illustrated in FIG. 25B, second data 814 transmitted in a second period following the first period may be output as [00000000] in which all bits are inverted, rather than [11111111]. In this case, DBI data may be '1'. Accordingly, all bits of the 8-bit data are not changed between the first period and the second period, such that SNR characteristics of a signal may be optimized and power consumed for data transmission may also be decreased.

Figure 26A:
Figure 26B:

In an example embodiment illustrated in FIGS. 26A and 26B, the memory device may control the bit line sense amplifier to execute the first read operation including the NOT operation in order to minimize interference between bits occurring in a process of continuously transmitting data. First, referring to FIG. 26A illustrating Comparative Example, first data 821 transmitted by the memory device in a first period may be 8-bit data, which is [00001000], and second data 822 transmitted by the memory device in a second period following the first period may be [11110111]. When the first data 821 and the second data 822 are consecutively transmitted as they are, a fourth bit D3 is changed from '1' to '0' and the other bits D0 to D2 and D4 to D7 are changed from '0' to '1', and thus, the fourth bit D3 may be affected by the other bits (D0 to D2, D4 to D7), such that noise may be generated.

In an example embodiment, as illustrated in FIG. 26B, the interference between the bits may be decreased by adding 1-bit DBI data to 8-bit data to be transmitted, and inverting the bits of the 8-bit data and transmitting the data of which the bits are inverted, if necessary. Referring to FIG. 26B, first data 823 transmitted in a first period may be [00001000] as illustrated in FIG. 26A. Bits of the first data 813 are not inverted, and DBI data may thus be '0'.

In an example embodiment illustrated in FIG. 26B, second data 824 transmitted in a second period following the first period may be output as [00001000] in which all bits are inverted, rather than [11110111], and '1' may be output as DBI data. Accordingly, the bits of the 8-bit data may not be changed between the first period and the second period, and interference between the bits may be decreased and power consumed for data transmission may be decreased.

In example embodiments described with reference to FIGS. 25A, 25B, 26A, and 26B, the inversion of the bits included in the data may also be executed by the bit line sense amplifier rather than a separate inversion circuit. The memory device may invert the bits of the data by allowing the bit line sense amplifier to execute the charge sharing operation prior to the offset canceling operation when the inversion of the bits is required.

In an example embodiment, the NOT operation may be executed using the bit line sense amplifier executing the read operation and the like in the memory device. The NOT operation is an operation of converting the bits of the data, and accordingly, in the memory device according to an example embodiment, various functions may be implemented using the bit line sense amplifier capable of executing the NOT operation.

As an example, the DBI function may be implemented using the bit line sense amplifier capable of executing the NOT operation, and power consumed for data transmission may be decreased or noise or the like that may be generated at the time of the data transmission may be minimized. In addition, when continuous or intensive access to a specific word line occurs, data of the memory cells connected to the specific word line are inverted and stored, such that damage to data of memory cells connected to the other word lines due to the row hammer may be prevented.

In addition, the bit line sense amplifier according to an example embodiment may be used for a zeroing operation of a memory device. The zeroing operation may be an operation of writing data of memory cells included in a partial region of the memory cell array as '0' for the purpose of security or the like. When the memory device receives a command to execute a zeroing operation for a selected region corresponding to at least a portion of the memory cell array, the memory device may instruct a bit line sense amplifier connected to a memory cell in which data '1' is written among memory cells disposed in the selected region to execute the first read operation. The bit line sense amplifier may read data '0' from the memory cell in which data '1' is written by executing the first read operation, and may store data '0' in the memory cell again to execute the zeroing operation.

According to example embodiments, the bit line sense amplifier may invert and read data stored in the memory cell by executing the charge sharing operation prior to the offset canceling operation. Accordingly, the NOT operation may be implemented in the bit line sense amplifier without adding a separate circuit, and the data bus inversion (DBI) or the like may be implemented using the NOT operation of inverting data to decrease power consumption of the memory device. In addition, when the row hammer phenomenon arises, the bit line sense amplifier may invert and store data of memory cells connected to a word line where the access is concentrated, and bit flip of the memory cells due to the row hammer may thus be minimized, such that performance of the memory device may be improved.

The present inventive concept is not limited by the example embodiments described above and the accompanying drawings, but is intended to be limited by the appended claims. Therefore, various types of substitutions, modifications, and alterations may be made by those skilled in the art without departing from the spirit of the present inventive concept as defined by the appended claims, and these substitutions, modifications, and alterations are to be fall within the scope of the present inventive concept.

What is claimed is:

1. A memory device comprising:
a memory cell array including a plurality of memory cells;
a plurality of bit line sense amplifiers connected to the plurality of memory cells through a plurality of bit lines and a plurality of complementary bit lines; and
a control logic configured to control the plurality of bit line sense amplifiers to execute a first read operation and a second read operation of reading data stored in a portion of the plurality of memory cells,
wherein the plurality of bit line sense amplifiers are configured to:
in the first read operation, invert the data stored in the portion of the plurality of memory cells, and output the inverted data, and
in the second read operation, output the data stored in the portion of the plurality of memory cells.

2. The memory device of claim 1, wherein the control logic is configured to execute a NOT operation for the data stored in the portion of the plurality of memory cells by executing the first read operation.

3. The memory device of claim 1, wherein the plurality of memory cells are connected to a plurality of word lines, and
wherein when intensive access to a first word line of the plurality of word lines occurs, the control logic is configured to store data obtained by executing the first read operation for a first set of memory cells connected to the first word line in the first set of memory cells.

4. The memory device of claim 1, wherein the control logic is configured to execute the first read operation or the second read operation based on the number of 1s included in the data stored in the portion of the plurality of memory cells.

5. The memory device of claim 4, wherein the control logic is configured to:
execute the first read operation when the number of 1s included in the data stored in the portion of the plurality of memory cells is greater than the number of 0s included in the data, and
execute the second read operation when the number of 0s included in the data stored in the portion of the plurality of memory cells is greater than the number of 1s included in the data.

6. The memory device of claim 1, wherein the control logic is configured to:
control the plurality of bit line sense amplifiers to sequentially obtain first data and second data of n bits from the plurality of memory cells, and
execute the first read operation or the second read operation based on a difference between bits included in each of the first data and the second data.

7. The memory device of claim 6, wherein the control logic is configured to execute the first read operation or the second read operation so that the difference between the bits included in each of the first data and the second data is minimized.

8. The memory device of claim 1, wherein the control logic is configured to execute the first read operation for a memory cell having data '1' from among at least some of the plurality of memory cells when the memory device receives a zeroing command for the at least some of the plurality of memory cells.

* * * * *